US006831463B1

(12) United States Patent
Pulyer

(10) Patent No.: US 6,831,463 B1
(45) Date of Patent: Dec. 14, 2004

(54) FERROREFRACTION MRI SYSTEM HAVING TWO ORTHOGONAL REMOTE FIELD POLARIZATION AXES

(75) Inventor: Yuly M. Pulyer, Brooklyn, NY (US)

(73) Assignee: Brigham and Women's Hospital, Boston, MA (US)

( * ) Notice: Subject to any disclaimer, the term of this patent is extended or adjusted under 35 U.S.C. 154(b) by 0 days.

(21) Appl. No.: 10/682,165

(22) Filed: Oct. 8, 2003

Related U.S. Application Data

(60) Provisional application No. 60/480,075, filed on Jun. 20, 2003.

(51) Int. Cl.[7] .............................................. G01V 3/00
(52) U.S. Cl. ...................................... 324/319; 335/297
(58) Field of Search ................................ 324/319, 320, 324/322, 300, 307; 600/410, 411, 421; 335/297, 296, 299, 306

(56) References Cited

U.S. PATENT DOCUMENTS

| | | | |
|---|---|---|---|
| 4,350,955 A | 9/1982 | Jackson et al. | |
| 4,379,262 A | 4/1983 | Young | |
| 4,590,427 A | 5/1986 | Fukushima et al. | |
| 4,682,111 A | 7/1987 | Hughes | |
| 5,049,848 A | 9/1991 | Pulyer | |

(List continued on next page.)

OTHER PUBLICATIONS

Cooper, et al., "Remote (Inside–Out) NMR. I. Remote Production of a Region of Homogeneous Magnetic Field*", Journal of Magnetic Resonance 41, 400–405 (1980).
Burnett, et al., "Remote (Inside–Out) NMR. II. Sensitivity of NMR Detection for External Samples*", Journal of Magnetic Resonance 41, 406–410 (1980).
Jackson, et al., "Remote (Inside–Out) NMR. III. Detection of Nuclear Magnetic Resonance in a Remotely Produced Region of Homogeneous Magnetic Field*", Journal of Magnetic Resonance 41, 411–421 (1980).
Kandarpa, et al., "Prototype Miniature Endoluminal MR Imaging Catheter[1]", Journal of Vascular and Interventional Radiology, May–Jun. 1993, vol. 4, No. 3.

*Primary Examiner*—Louis Arana
(74) *Attorney, Agent, or Firm*—George W. Neuner; Edwards & Angell LLP

(57) ABSTRACT

A planar MRI system is disclosed. The system has an open magnet configuration that produces a magnetic field having a remote region of substantial magnetic field homogeneity. Spatial encoding gradient coils and a rf coil provide MRI data for image reconstruction. A first magnet system having a first ferromagnetic core and a first longitudinal axis with a first pair of coils around the first ferromagnetic core and spaced apart along the first longitudinal axis is located orthogonal to and in substantially the same plane as a second magnet system having a second ferromagnetic core and a second longitudinal axis with a second pair of coils around the second ferromagnetic core and spaced apart along the second longitudinal axis. The open magnet configuration preferably has a ferromagnetic core with a substantially planar core surface layer and a longitudinal axis, and a unipolar current wire pair on a side of the ferromagnetic core adjacent the planar core surface layer. The wire pair is separated along the longitudinal axis and extends in a direction substantially perpendicular to the axis and substantially parallel to the planar core surface layer. The current wire pair provides a magnetic field having a maximum between the current wire pair along a direction perpendicular to the planar core surface layer and in the remote region of substantial magnetic field homogeneity. The planar core surface layer of the ferromagnetic core provides an orthogonal refractory effect in the form of mirror imaging current wires having the same polarity as the current wire pair that substantially increases the resulting magnetic field compared to a magnetic field generated by the current wire pair in free space.

24 Claims, 19 Drawing Sheets

U.S. PATENT DOCUMENTS

| | | |
|---|---|---|
| 5,117,188 A | 5/1992 | Ohkawa |
| 5,296,811 A | 3/1994 | Ehnholm et al. |
| 5,331,282 A | 7/1994 | McDougall et al. |
| 5,334,937 A | 8/1994 | Peck et al. |
| 5,378,988 A | 1/1995 | Pulyer |
| 5,389,879 A | 2/1995 | Pulyer |
| 5,390,673 A | 2/1995 | Kikinis |
| 5,402,094 A | 3/1995 | Enge |
| 5,428,292 A | 6/1995 | Dorri et al. |
| 5,432,446 A | 7/1995 | MacInnis et al. |
| 5,462,054 A | 10/1995 | Rapoport et al. |
| 5,572,132 A | 11/1996 | Pulyer et al. |
| 5,614,880 A * | 3/1997 | Palkovich et al. .......... 335/299 |
| 5,677,630 A | 10/1997 | Laskaris et al. |
| 5,744,960 A | 4/1998 | Pulyer |
| 5,914,600 A | 6/1999 | Pulyer |
| 6,002,255 A | 12/1999 | Pulyer |
| 6,130,538 A * | 10/2000 | Carrozzi et al. ............ 324/319 |
| 6,190,517 B1 * | 2/2001 | Davis et al. ........... 204/298.16 |

* cited by examiner

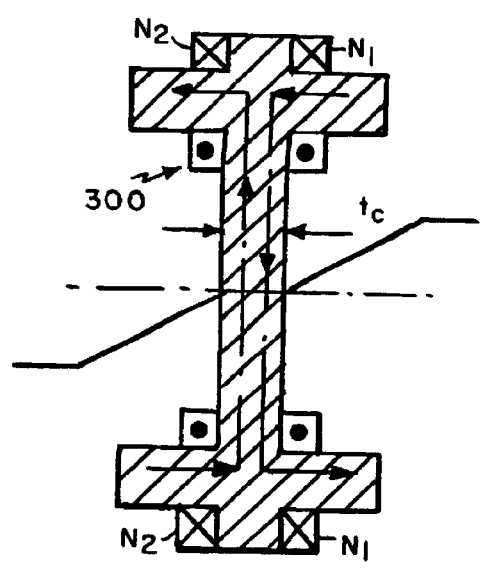
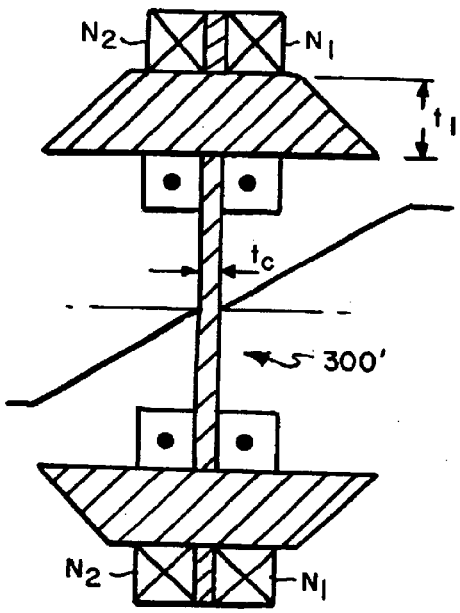
FIG. 15A
FIG. 15B
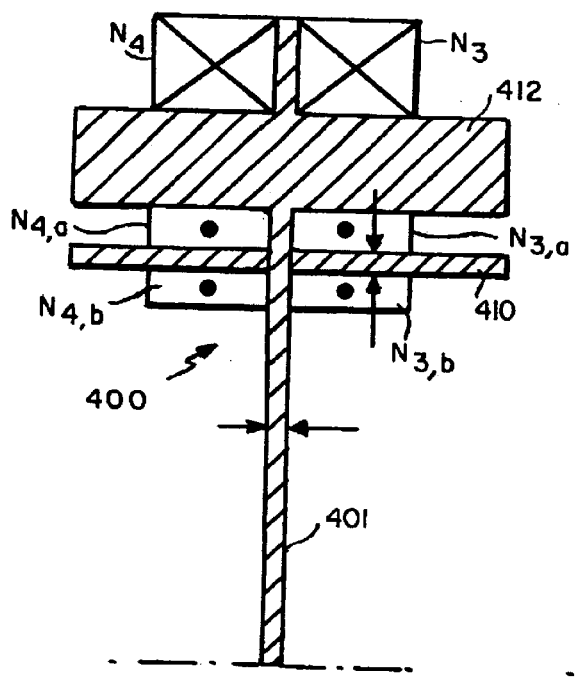
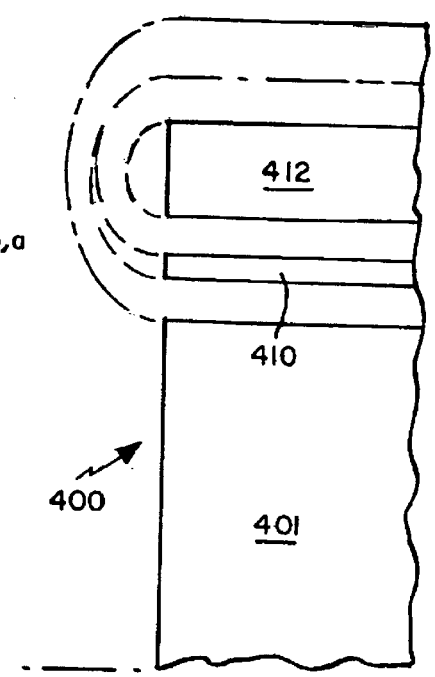
FIG. 16A
FIG. 16B

US 6,831,463 B1

FERROREFRACTION MRI SYSTEM HAVING TWO ORTHOGONAL REMOTE FIELD POLARIZATION AXES

This application claims the benefit of 60/480,075 filed Jun. 20, 2003.

FIELD OF THE INVENTION

This invention relates magnetic resonance imaging (MRI) systems, to magnet systems for producing a homogeneous imaging field for MRI and, particularly, to open magnet systems having two orthogonal polarization axes and providing a remote region of field homogeneity along with planar gradient coils for delivering gradient fields for spatial encoding in a remote target field region. More particularly, this invention relates to MRI magnet systems having a pair of current loops wound about a substantially planar ferromagnetic core, the core preferably including an orthogonal end piece.

BACKGROUND OF THE INVENTION

There are known whole body MRI magnets (superconductive, resistive iron core magnets, and permanent magnets), which produce the background $B_o$ field used in MRI. The useable imaging volume in these magnets is in the region where the field is an extremum and provides a region of substantial field homogeneity. This volume is located in the air space centrally located between field sources. Thus, typically, MRI magnets are designed to provide a homogeneous magnetic field in an internal region within the magnet, e.g., in the air space of a large central bore of a solenoid or in the air gap between the magnetic poles of a C-type magnet. A patient or object to be imaged is positioned in the homogeneous field region located in such air space. In addition to the main or primary magnet that provides the background magnetic field $B_o$, the MRI system typically has gradient and rf coils, which are, used respectively for spatial encoding and exciting/detecting the nuclei for imaging. These gradient field and rf coils are typically located external to the patient inside the geometry of the $B_o$ magnet surrounding the central air space.

Prior art electromagnets such as described by Watson et al and Muller et al. and other prior art iron core magnets typically have a structural design to provide a maximum magnetic field strength at a large central air space. In addition, those types of the prior art magnets, of the iron core electro- or permanent type, have a substantial edge fringe field effect, which makes it difficult to image beginning immediately at the magnet edge or even proximal to the edge of the magnet due to lack of sufficient field homogeneity.

In U.S. Pat. No. 5,049,848 a magnet configuration for MRI mammography is disclosed. The magnetic structure 50 has a rectangular shaped magnet with at least two parallel magnetic source 5,6 connected by a ferromagnetic core flux path defining an air gap for imaging. A remote shimming C-shaped magnetic source is preferably used for shimming to decrease the front edge fringe effect of the magnetic structure 50 to create a relatively homogeneous field in the air gap beginning at the front edge for effective imaging.

Solenoidal MRI magnets (superconductive, resistive) as well as iron core C and E shape electromagnets or permanent magnets are known for imaging of the whole body and its extremities. However, such whole body MRI magnets are not generally well-suited for treatment of the patient with other modalities or for minimally invasive surgical procedures guided by real time MRI because of the limited access of the surgeon to the patient. This limited access results from the field producing means surrounding the imaging volume. Electromagnets of the C or E type iron core configuration have been designed to offer a partially open access to the patient, however, the access is still very limited with typical air gaps of only 40 cm between the pole pieces of a C type magnet. U.S. Pat. No. 5,378,988 describes a MRI system, which can provide access for a surgeon or other medical personnel, using a plurality of C-shape solenoidal magnets oriented to form an imaging volume in a central region of the magnets.

Another type of magnet specifically designed for interventional surgical guidance is General Electric's Magnetic Resonance Therapy device, which consists of two superconducting coils in a Helmholtz coil type arrangement (see U.S. Pat. No. 5,677,630). The air gap for this commercial magnet is about 58 cm, which typically permits access by one surgeon.

None of those prior art magnets or MRI systems is ideal with regard to simultaneously offering real time imaging and fully open access to the patient. Many surgical procedures require multiple surgeons together with an array of supporting equipment and, thus, a fully open magnet configuration for a MRI system for interventional procedures is desirable. In addition, such open magnet configuration is desirable for patients that have claustrophobia.

Applications other than MRI have used magnets that produce a useful field region outside the magnet geometry. U.S. Pat. No. 4,350,955 describes means for producing a cylindrically symmetric annular volume of a homogeneous magnetic field remote from the source of the field. Two equal field sources are arranged axially so that the axial components of the fields from the two sources are opposed, producing a region near and in the plane perpendicular to the axis and midway between the sources where the radial component of the field goes through a maximum. A region of relative homogeneity of the radial component of the background field $B_r$ may be found near the maximum. The large radial field is generally denoted as the $B_o$ background field in MRI applications. See also, *J. Mag. Resonance* 1980, 41:400–5; *J. Mag. Resonance* 1980, 41:406–10; *J. Mag. Resonance* 1980, 41:411–21. Thus, two coils producing magnetic fields having opposing direction are positioned axially in a spaced relationship to produce a relatively homogeneous toroidal magnet field region in a plane between the magnets and perpendicular to the axis of cylindrical symmetry. This technology has been used to provide spectroscopic information for oil well logging but has not been used for imaging.

U.S. Pat. No. 5,572,132 describes a magnetic resonance imaging (MRI) probe having an external background magnetic field $B_o$. The probe has a primary magnet having a longitudinal axis and an external surface extending in the axial direction and a rf coil surrounding and proximal to the surface. The magnet provides a longitudinal axially directed field component $B_x$ having an external region of substantial homogeneity proximal to the surface. Comparing this magnet geometry to that of U.S. Pat. No. 4,350,955, it has a background $B_o$ field with a cylindrically symmetrical region of homogeneity. However, this magnet described in the copending application provides such a field in the axial direction (i.e., longitudinal axis direction) whereas the other provides a background $B_o$ field in the radial or r direction (i.e., radial direction). Preferably, the $B_o$ field is provided by two magnets spaced axially and in axial alignment in the same orientation and wherein said region of homogeneity intersects a plane that is located between the magnets and that is perpendicular to the axis. For MR imaging, surrounding the primary magnet are r-, z- and φ-gradient coils to provide spatial encoding fields.

It is desirable to have new and better devices and techniques for biomedical MRI applications such as open magnet MRI systems for imaging while performing surgery or other treatments on patients or for imaging patients that have claustrophobia. It is also desirable to have portable devices and imaging techniques that could be applied to a wide variety of imaging uses.

U.S. Pat. No. 5,744,960 describes a planar MRI system having an open magnet configuration comprising two pairs of planar pole pieces that produces a magnetic field having a substantial remote region of homogeneity.

U.S. Pat. No. 5,914,600 describes an open solenoidal magnet configuration comprises a pair of primary solenoidal coils and, located within the primary coil geometry, a bias coil system, the coils emitting an additive flux in the imaging region to generate a resulting field which provides a remote region of substantial field homogeneity.

U.S. Pat. No. 6,002,255 describes an open, planar MRI system having an open magnet configuration including a planar active shimming coil array that produces a magnetic field having a substantial remote region of homogeneity. The MRI system also includes spatial encoding gradient coils and a rf coil, each preferably having a planar configuration.

The prior art magnet configurations that provide a primary background magnetic field having a remote region of substantial field homogeneity typically comprise a primary magnet system having spaced primary field emission surfaces and, located between the spaced field emission surfaces, a bias magnet system having spaced bias field emission surfaces that emit an additive flux in the imaging region to generate a resulting field which provides a remote region of substantial field homogeneity. The spaced primary field emission surfaces typically are the pole pieces of a primary magnet or a solenoidal magnet facing the target region.

However, a fundamental problem for obtaining an open magnet having maximal accessibility for a surgeon to conduct MRI guided surgery results from the fact that conventional magnet systems exhibit a substantial drop in magnet efficiency when providing an open volume of magnetic field that is large enough for surgery to be conducted therein. Conventional iron core C-type magnet configurations provide a target field volume between coaxial pole pieces. That type of magnet configuration, even with air gap enlargement (reducing magnet efficiency), still has limited accessibility for MRI guided surgery. MRI magnet systems in the form of one side "pancake type" magnet configurations (e.g. U.S. Pat. No. 5,331,282) generally have a set of coaxial circular coils with alternating polarity and axially shifted positions and provide relatively low level of remoteness and require a large diameter magnet for adequate field strength, thus, inhibiting accessibility to the region of field homogenity. So-called "open" solenoid superconductive magnets (e.g., U.S. Pat. No. 5,677,630) provide better accessibility and larger field of view (FOV) but accessibility still is limited by axial distance between two solenoidal magnets (which typically is about the width of a person's shoulders). The planar open magnet systems mentioned above (e.g., U.S. Pat. No. 5,378,988; U.S. Pat. No. 5,744,960; U.S. Pat. No. 5,914,600 and U.S. Pat. No. 6,002,255) provide complete openess for excellent accessibility but suffer still from a limitation in magnet efficiency.

Thus, there remains a need to provide a more efficient, economical, open magnet MRI system having a remote region of substantial field homogeneity.

SUMMARY OF THE INVENTION

The present invention provides a MRI magnet system that generates two orthogonal magnetic fields to provide a remote field of homogeneity. The two axis field polarization topology provided by the present invention has magnet system symmetry in two axes providing two orthogonal magnetic fields. For example, a pole pair along the Z-axis generates a remote field in the XY plane and a pole pair along the Y-axis generates a remote field in XZ plane. When using a pole pair along the Z-axis and a pole pair along the Y-axis, i.e., two pole pairs having orthogonal axes, the fields are additive as the vector sum of the two orthogonal fields and provide a maximum in the field strength in the X direction.

The present invention provides a planar MRI system having an open magnet configuration that produces a magnetic field having a substantial remote region of homogeneity. The MRI system includes spatial encoding gradient coils and a rf coil, each preferably having a planar configuration. In a preferred embodiment of the present invention, the magnet configuration comprises, for each of two orthogonal directions, a substantially planar ferromagnetic core around which is wound a pair of primary coils, the coils providing primary current wires on one side of the planar core emitting a flux in the imaging region to generate a resulting magnetic field which provides a remote region of substantial field homogeneity. Preferably, the same planar ferromagnetic core is used for both pairs of primary current wires.

The ferromagnetic core preferably is a plate of a material having high permeability. Further, the core preferably is made by laminating layers of ferromagnetic material to form the substantially planar structure of the core.

The planar ferromagnetic core provides a magnetic shield between the primary current wires on one side of the core plane and the return wires of the current loops on the opposite side of the core plane. In addition, the planar ferromagnetic core is constructed to provide a refractive effect that magnifies the magnetic field provided by the current wires by an imaginary current ("mirror image") effect when compared to the field provided by the current wires alone. Preferably, the distance between the primary current wires emitting the field and the return wires of the current loops is minimized to reduce the amount of copper and the loss effects for the coil having a particular length of current wire on the surface of the planar core facing the target volume having a region of substantial field homogeneity. In other words the thickness of the planar core preferably is minimized while also providing maximum field strength. However, it also is preferred that the core material adjacent the coil wires be near saturation (but not saturated) when the magnet system is operated. Thus, the core is designed preferably to prevent saturation while operating near saturation in a region near the current wires to obtain a maximum magnetic induction (i.e., B-field) in the core for the ampere turns provided.

In a preferred embodiment of the invention, at opposite ends (i.e., poles) of the planar ferromagnetic core, a wall of ferromagnetic material is provided, for example the core ends can be extended substantially perpendicular to the plane of the core (as defined by the portion of the core lying between the pair of current loops), on the side of the core on which lies the desired remote field of substantial homogeneity. The perpendicular extension of the ends provides an additional magnification effect of the primary current wires to the resulting field strength in the remote region of substantial field homogeneity. More preferably, the ends are extended at an acute angle with the plane of the core lying between the pair of current loops. The angle of the end extensions measured from the perpendicular is about 20° or less. Preferably, the angle of the end extensions measured from the perpendicular is about 15° or less. Most preferably, the angle of the end extensions measured from the perpendicular is in the range of about 10 to 15°. The vertical, or angled, end extension or wall structure is provided symmetrically for each of the two axis orthogonal topologies.

Preferably, the end extensions also are made by laminating layers of ferromagnetic material, similar to the construction of the planar ferromagnetic core.

In other preferred embodiments, more than one pair of primary current wires is used for each orthogonal axis magnet topology to provide the desired remote region of substantial field homogeneity. In addition, one or more pair of shimming current wires preferably are used for each orthogonal axis magnet topology to compensate for deflections in the field profile provided by the primary current wires. The shimming current wires preferably can be located on a plane that is closer to the remote region of substantial field homogeneity than the plane of the primary current wires. The use of a shimming planar ferromagnetic core (which typically is much thinner than the primary ferromagnetic core and can be in sections corresponding to the location of particular shimming current wires) also is preferred for the shimming current wires to obtain magnet efficiency.

The magnet configuration of certain embodiments of the present invention can be used to provide two back to back magnet pairs with a common core to provide a two sided MRI system because the ferromagnetic core provides shielding of one field from the other, although producing the two fields on opposite sides of the core with the same primary coils. Thus, a further economy can be obtained where such a back to back configuration can be utilized to provide double patient throughput such as, for example, in mass screening applications such as mammography screening.

Preferably, the magnet configuration providing the remote region of substantial field homogeneity is located on one side of a plane, which is parallel to the plane of the electromagnet ferromagnetic core and separates a patient or body component to be imaged from the magnet configuration, thereby providing a planar open magnet configuration. As described herein, the Y-axis and Z-axis define the orientation of the planar surface, and the X-axis is perpendicular to the planar surface in a rectangular coordinate system. Thus, the background field for the two orthogonal axis magnet system has a direction substantially parallel to the ZY-plane in the rectangular coordinate system and is the vector sum of the first field in a direction parallel to the Z-axis generated by one of the primary current pairs plus the second field in a direction parallel to the Y-axis generated by the other one of the primary current pairs.

As used herein, the term "remote" means that the field region is located external to the plane of current wires producing the magnetic field. As used herein, the terms "substantial homogeneity", "substantial field homogeneity" or "substantial relative field homogeneity" refer to and mean a region having magnetic field homogeneity sufficient for producing MRI images of the desired quality in the region of field maximum.

As used herein, the term "substantially planar" means that the surface of the core facing the desired magnetic field is a flat surface. It should be noted that the thickness of the core for a particular core material will depend upon the desired magnitude of the field to be provided by the magnet, i.e., upon the number of ampere-turns used to excite a given field.

The distance of the region of homogeneity from the planar surface can be controlled basically by varying the spacing between the primary coil pairs. The primary coil pairs are the major source for background field and determine the basic field strength. Preferably using minimal additional power, the shimming coil pairs provide compensation for field deflection resulting from the primary coils and contribute to the degree of homogeneity of the background field. The size, geometry and spacing of the coils can influence the size of the homogeneous region.

The MRI system also preferably has (i) a planar xyz gradient coil system that produces a gradient field for spatial encoding in the region of homogeneity, i.e., the imaging volume or target region, as well as (ii) rf excitation and receiving coil (or coils).

The size of the magnet configuration and MRI system in accord with the present invention can be varied to provide whole body imaging or portable systems for localized imaging.

BRIEF DESCRIPTION OF THE DRAWINGS

FIG. 15A is a cross-sectional side view of an embodiment of an one axis double sided magnet that provides a differential flux in the vertical core section.

FIG. 15B is a cross-sectional side view of an alternative embodiment of an one axis double sided magnet that provides a differential flux in the vertical core section.

FIG. 16A is a cross-sectional side view of an embodiment of an end section of an one axis double sided magnet that provides a differential flux in the both the vertical core section and a horizontal core section.

FIG. 16B is a plan view of the one axis double sided magnet of FIG. 16A.

DETAILED DESCRIPTION OF THE INVENTION

Figure 1:
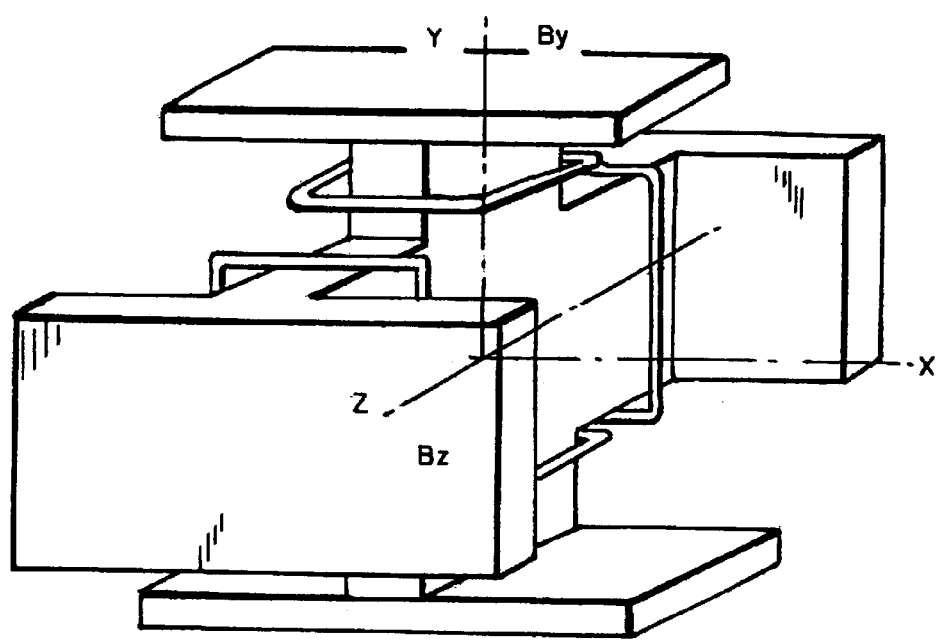
FIG. 1 is an isometric illustration of a simplified two orthogonal axis magnet topology with vertical end core extension for refraction in accord with one embodiment of the present invention.

The invention will be described with reference to the drawings wherein like reference numerals in different figures refer to the same component. In accord with the present invention, a magnet configuration for a MRI system is an open device that provides a background $B_o$ magnetic field having a remote region of substantial homogeneity and oriented substantially parallel to the plane of the ferromagnetic core portion that is between a primary pair of current wires that provides the magnetic field. The magnet configuration of the present invention provides two magnet systems comprising pole pairs along a longitudinal axis wherein the axes are positioned orthogonal to each other, each generating a background $B_o$ magnetic field in the direction of its longitudinal axis. Thus, the total background field is the vector sum of the two individual background fields generated by the two orthogonal magnet systems.

FIG. 1 illustrates the concept of two magnets, each consisting of a pair of coils around a ferromagnetic core and separated from each other along a directional axis, wherein the two magnets (i.e., a Y direction magnet and a Z direction magnet) are orthogonal two each other. In the illustration the magnets are along the Y and Z axes, respectively, of a rectangular coordinate system. The ferromagnetic core is illustrated as a common core for both magnets. Also, the opposite ends of each magnet are extended vertically to provide a ferro-refraction effect. As illustrated in more detail in FIG. 3A, the pair of coils separated from each other along a directional axis provide separated pairs of current wires having the same polarity to provide a maximum in the magnetic field remote from the plane of the wire current pair.

Figure 2A:
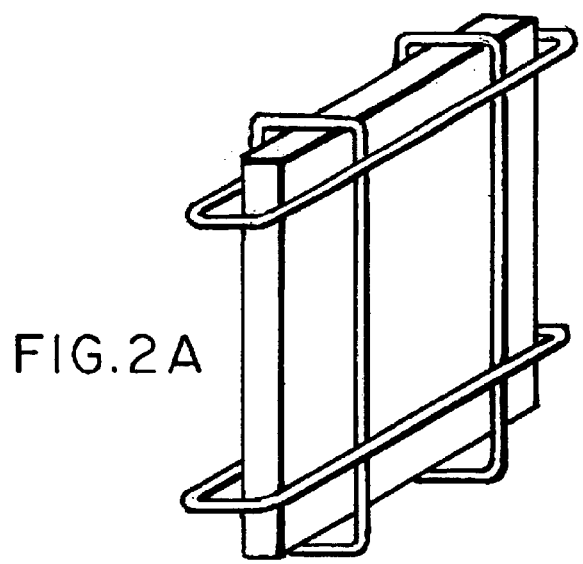
FIG. 2A is a concept schematic of a two orthogonal axis magnet topology for a planar ferro-refraction system in accord with one embodiment of the present invention.
Figure 2B:
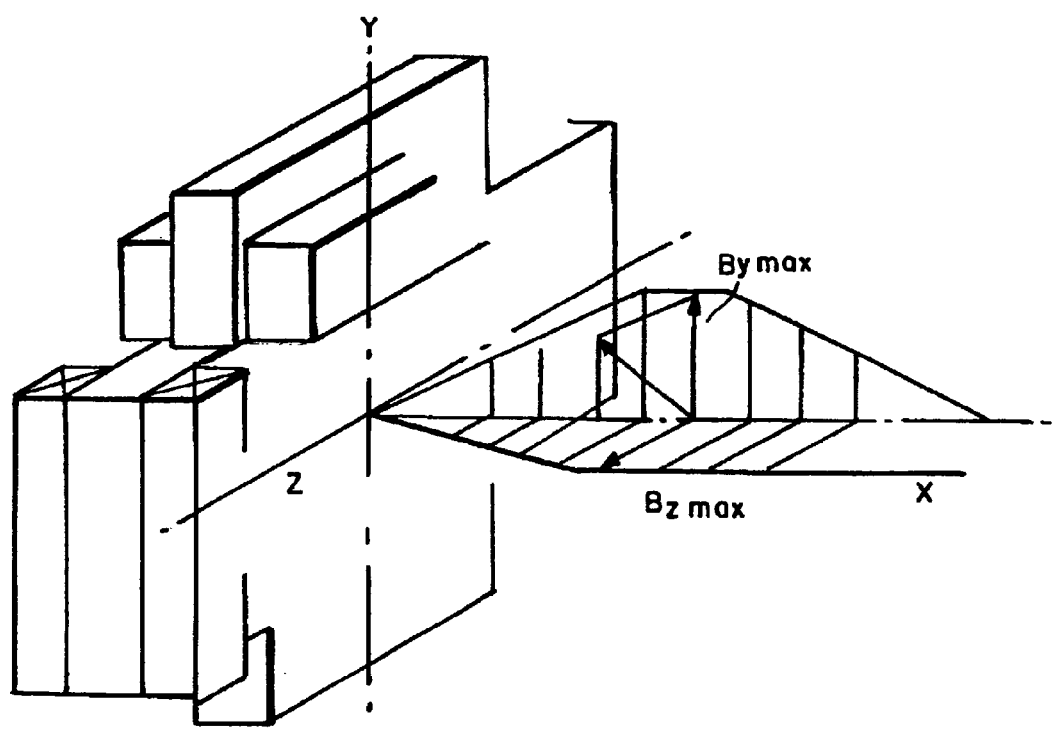
FIG. 2B is an isometric view of a two orthogonal axis magnet topology illustrating corner coil design for the concept illustrated in FIG. 2A.
Figure 2C:
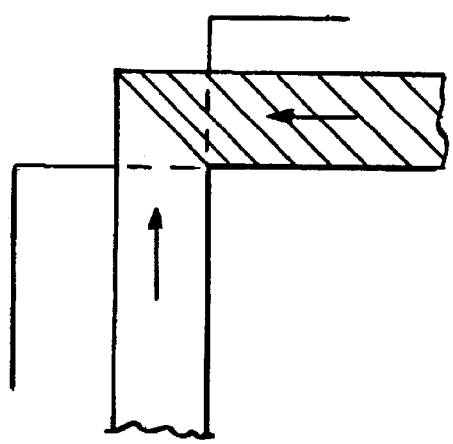
FIG. 2C illustrates a triangular corner topology for the two orthogonal corner coils of FIG. 2A.
Figure 2D:
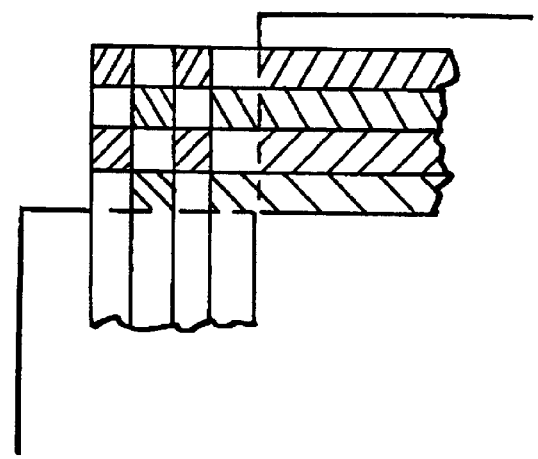
FIG. 2D illustrates a checkered corner topology for the two orthogonal corner coils of FIG. 2A.
Figure 2E:
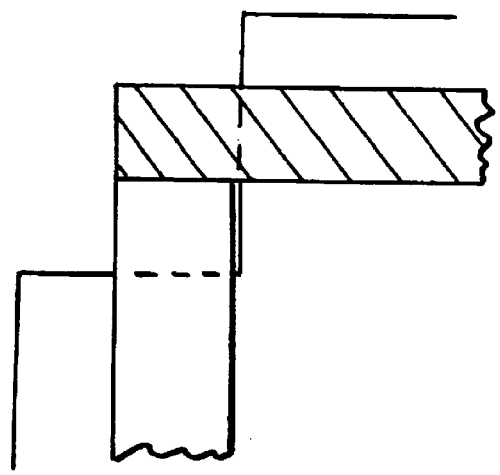
FIG. 2E illustrates an alternative corner topology for the two orthogonal corner coils of FIG. 2A.

In FIGS. 2A–2E, a simple concept for two orthogonal magnets is illustrated using two pairs of coils as the magnet poles with a square ferromagnetic planar common core (FIG. 2A). FIG. 2B illustrates an embodiment where the corners of the ferromagnetic core material are cut away to facilitate wrapping the coils around opposing edges of the planar core. FIGS. 2C–2E illustrate various corner topologies that can be utilized when making the two orthogonal magnets in this configuration.

Figures 3A, 3B:
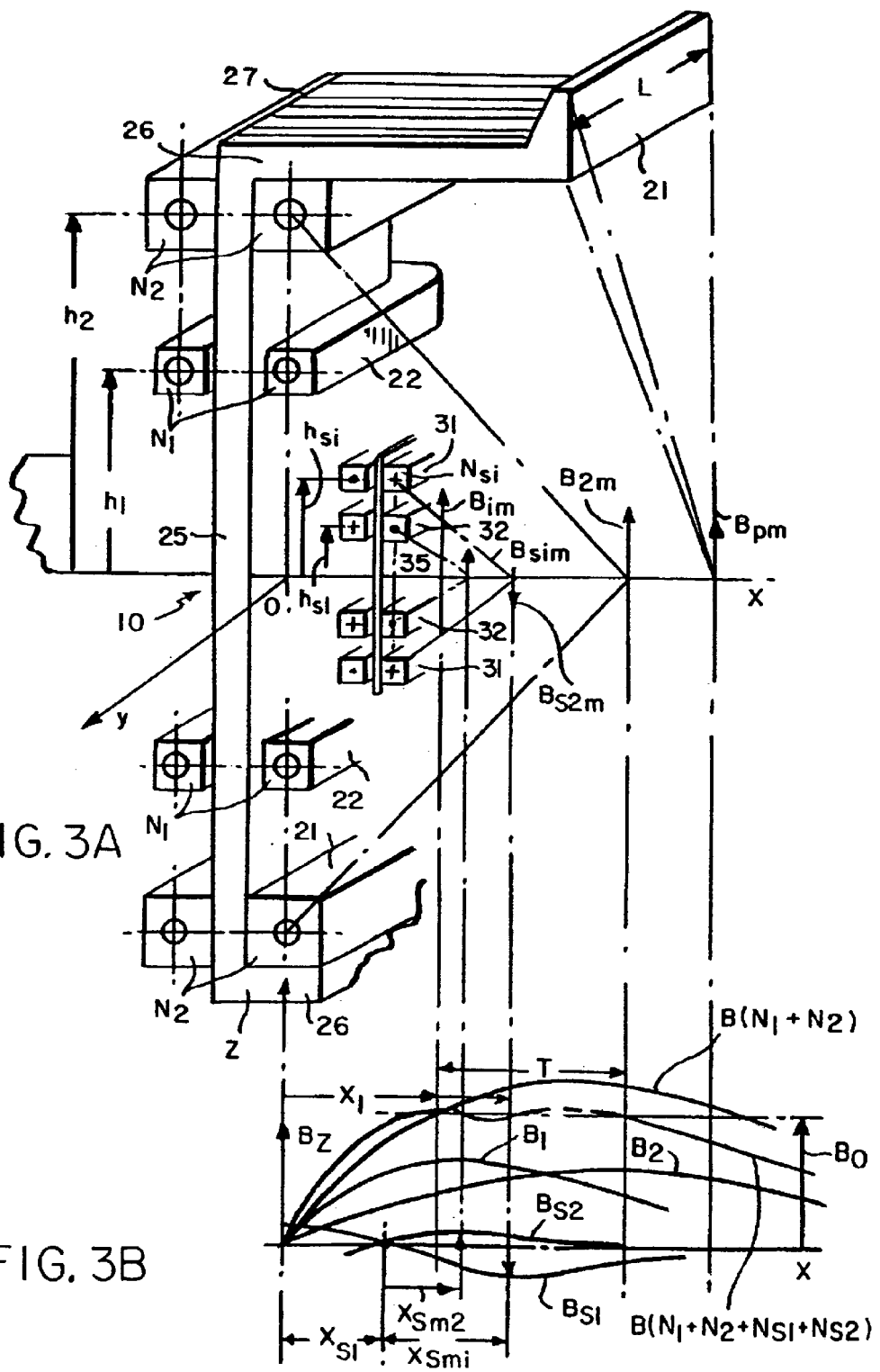
FIG. 3A is a cross sectional view of an isometric illustration of a magnet configuration useful for one axis of a two orthogonal axis magnet topology in accord with one embodiment of the present invention.
FIG. 3B is an illustration of the background magnetic field $B_o$ along the X-axis provided by the magnetic configuration of FIG. 3A.

As illustrated in FIG. 3A, one embodiment of a magnet system 10 (illustrated with current pair along the Z-axis) for one axis of a two orthogonal axis magnet topology in accord with the present invention has a pair of primary current wires divided into two portions. A second magnet system (i.e., having a current pair along the Y-axis) is positioned orthogonally to the first magnet system to provide the two orthogonal axis magnet topology having a remote maximum in the X-direction in accord with one embodiment of the present invention.

As illustrated, first portion of primary current wires 21 (provided by $N_2$ turns of the coil), and a second portion of primary current wires 22 (provided by $N_1$ turns) on one side of a ferromagnetic plate 25 (around which the coils are wound). Each portion of primary current wires have a first group of wires having one polarity spaced apart from a second group of wires having same polarity along the longitudinal axis (i.e., Z axis in FIG. 3A) of the ferromagnetic plate, which serves as a core for the coils. In addition, the ferromagnetic plate provides high magnetic conductivity (due to high permeability of the material) in the core region between the primary current wires and the return wires provided by the loops, which return wires have opposite polarity. The ferromagnetic plate also can be considered to provide a magnetic shielding effect between the primary current wires lying on one side of the plate and the return wires of the coils lying on the opposite side of the plate (which can be used to provide independent magnetic field generation on opposite sides of the core plate).

Preferably, ends 26 of the ferromagnetic plate 25 are extended orthogonal to the longitudinal axis (i.e., in the X direction in FIG. 3A). The ends 26 also preferably can have a pole piece 27, which can have a geometry to aid in shaping the magnetic field provided by the magnet system 10. However, the primary field is generated by the pairs of primary current wires.

Shimming of the magnetic field is provided by a first pair of shimming current wire groups 31 having $N_{a1}$ wires in each group and a second pair of shimming current wire groups 32 having $N_{a2}$ wires in each group. In this embodiment, the current in the first pair of shimming current wires 31 has opposite polarity to the second pair of shimming current wires 32. However, the polarity can be in the same direction in both pair shimming wires. The pairs of shimming wire groups are wound about a ferromagnetic plate 35 and spaced along the longitudinal axis thereof. Preferably, ferromagnetic plate 35 can be segmented to maximize the shimming field contribution from each shimming current wire and, at he same time, to minimize a shunting effect on the primary field. Orthogonal end extensions and optionally even pole pieces, similar to plate 25, may be provided in certain circumstances. Ferromagnetic plates 25 and 35 are positioned in parallel. The primary and shimming current wires are spaced symmetrically about a centerline of the ferromagnetic plates in the X direction (i.e., X=0), respectively. Typically, the centers of the core plates are aligned with the X,Y plane as illustrated.

It should be noted that the shimming of the target field region can be either active or passive.

The magnetic field in the Z direction $B_z$ along the X axis that is provided by the magnet system 10 (FIG. 3A) is illustrated in FIG. 3B. Curve $B_1$ is the field provided by primary current wires 21. Curve $B_2$ is the field provided by primary current wires 22. Curve $B_{s1}$ is the field provided by shimming current wires 31. Curve $B_{s2}$ is the field provided by shimming current wires 32. Curve $B(N_1+N_2)$ is the sum of the fields provided by the primary current wire group pairs ($B_1+B_2$). Curve $B(N_1+N_2+N_{s1}+N_{s2})$ is the sum of the fields provided by the primary and shimming current wire group pairs. T designates the region of substantial field homogeneity of magnetic field provided by the magnet system.

The ferromagnetic plates preferably are made by laminating together sheets of ferromagnetic material having the desired shape, e.g. the shape of a longitudinal cross section of the plate and optionally including orthogonal end extensions. As in transformer construction, the use of laminated sheets reduces induced currents (which can arise due to pulsing of gradient coils in a MRI system) and provides a more technological capability in manufacturing the magnet.

Figure 4B:
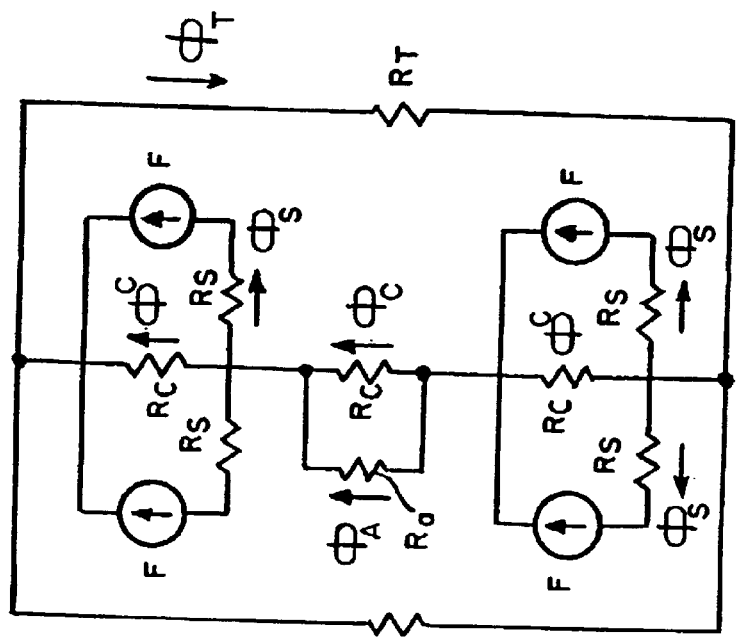
FIG. 4B is an equivalent magnetic circuit for the magnet configuration of FIG. 4A.
Figure 4A:
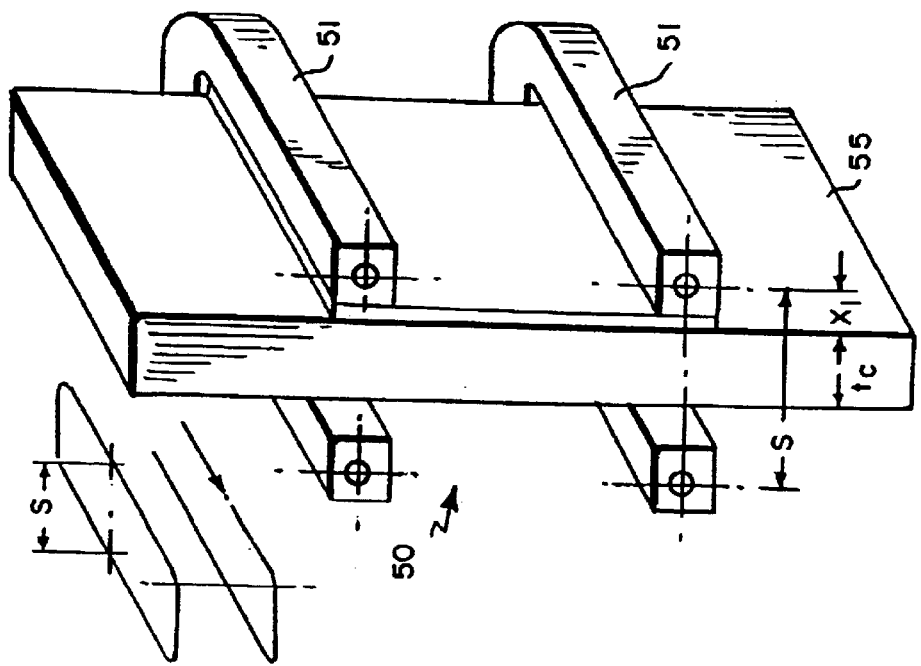
FIG. 4A is a cross sectional view of an isometric illustration of a magnet configuration illustrating one pair of current loops coupled with a planar ferromagnetic core for one axis of a two orthogonal axis magnet topology in accord with the present invention.

FIG. 4A illustrates a single axis magnet system 50 having only one pair of current wire groups 51 and a ferromagnetic plate 55 that consists of a plurality of sheets of ferromagnetic material. The thickness of the ferromagnetic plate 55 is variable depending upon the number of sheets laminated together to form the plate. A magnet system as illustrated was constructed to determine the effect of a ferromagnetic plate of thickness $t_c$ on the shielding of the return wires and the refraction effect. The coils providing the current wire groups were made of 18 gauge copper wire with 100 turns per coil and were spaced 8 cm apart on a core plate 30 cm long and 24 cm wide. The field was measured perpendicular to the plate at the center of the two coils with a current of 3 amps in each coil. The thickness of the plate $t_c$ was varied in increments of 0.3 mm, the thickness of the sheets of M6 transformer steel used for the laminations.

Two systems arranged as illustrated in FIG. 4A can be arranged orthogonally to provide the benefits of the present invention.

An equivalent lumped parameter magnetic circuit for the magnet system 50 of FIG. 4A is illustrated in FIG. 4B. The equivalent circuit can be used to compute a minimum thickness of the ferromagnetic core plate providing a maximum in the remote field. This computation is made to differentiate a contribution generated by the current wires and the contribution due to the mirror image effect due to refraction by the orthogonal core plate structure. Computations using the equivalent circuit can be performed by conventional circuit analysis well known to those skilled in the art.

The maximum field strength of the coils increase as a function of the number of laminated sheets used to make the core.

Figure 4C:
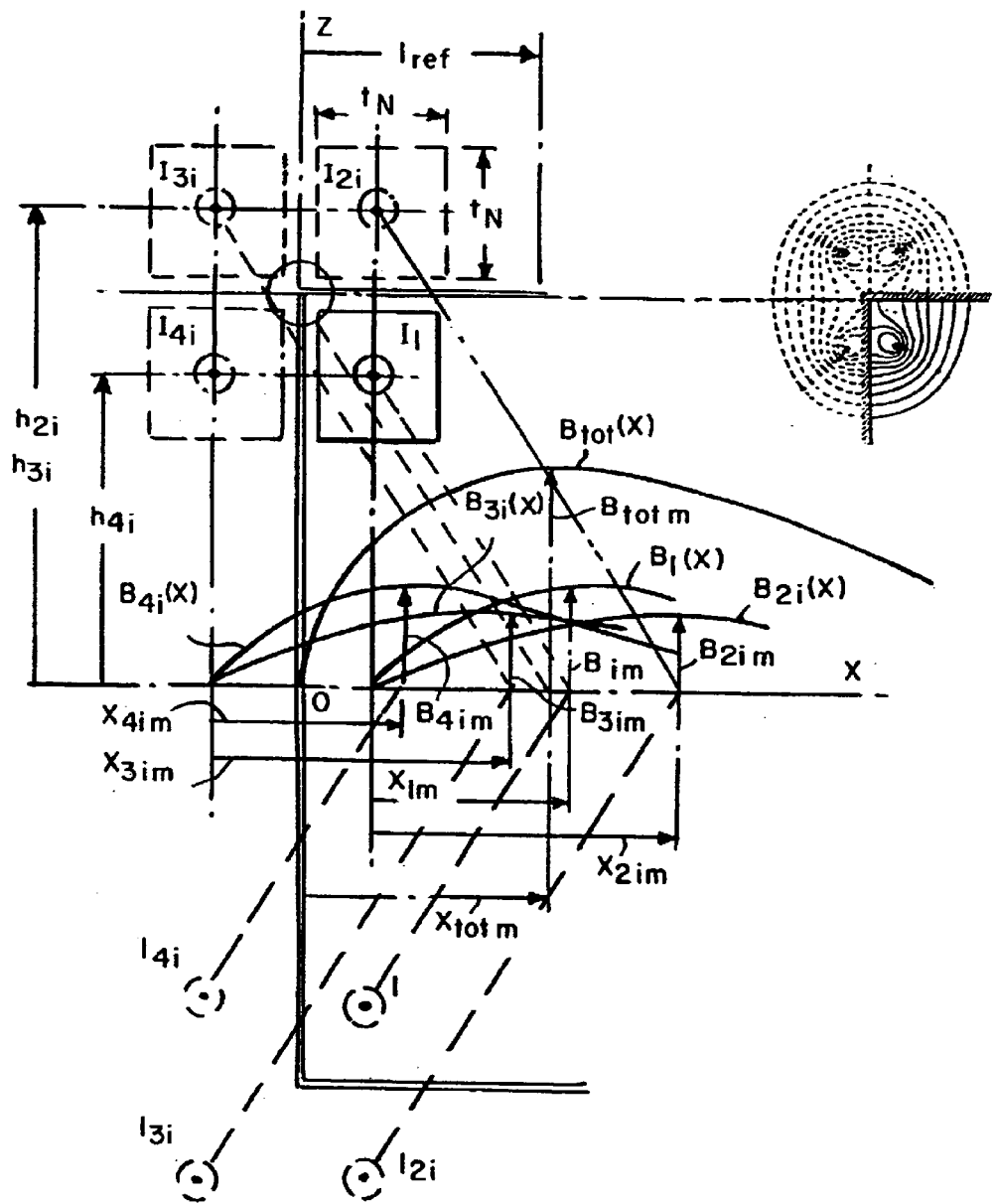
FIG. 4C is an illustration of imaginary current ("mirror image") refraction magnification effect provided to the field generated by a current wire by two perpendicular ferromagnetic plates positioned adjacent the length of the current wire.

The quadro imaginary current (i.e., "mirror") effect provided for a magnetic field generated by a straight wire $I_1$ by mutual orthogonal ferromagnetic core plates of infinite length is illustrated in FIG. 4C. The presence of the mutual orthogonal ferromagnetic plates has the effect of inducing a field from a unipolar current wire pair where the field can be calculated as if including a contribution from three other imaginary current wire pairs ($I_{2i}$, $I_{3i}$, $I_{4i}$) located on opposite sides of the mutually orthogonal ferromagnetic plates from the actual current wire $I_1$ as shown in the figure. A pair of wires $I_1$ produce a magnetic field $B_{1m}$ along the X axis. The orthogonal ferromagnetic end plates at each end of the magnet configuration provide an orthogonal equipotential boundary condition at high permeability and provide an effect to magnify the magnetic field produced by the actual pair of current wires $I_1$ alone thereby providing a total magnetic field $B_{tot}$ that is equal to the sum of magnetic fields produced as if imaginary current wires $I_{2i}$, $I_{3i}$, $I_{4i}$ were actual wires considered without the ferromagnetic core boundaries (this total field is called the "ferrorefraction" effect herein). The total magnetic field $B_{tot}$ produced by wires $I_1$ and the orthogonal ferromagnetic core plates is equal to the sum of $B_{1m}$, $B_{2im}$, $B_{3im}$ and $B_{4im}$. In actual magnet systems where the plates cannot be infinite for practical reasons, the magnification effect is less than theoretical.

Because of the magnetic shielding provided by the ferromagnetic core plate, the magnet structure of the present invention can be used to obtain two individual "back to back" magnet systems wherein the current to the primary coils is used to operate both magnet systems (i.e., providing a "double sided" magnet system). This can provide a cost effective operation mode for applications where back to back systems can be utilized, for example, in mass screening applications such as, specifically, mammography screening.

Figure 5:
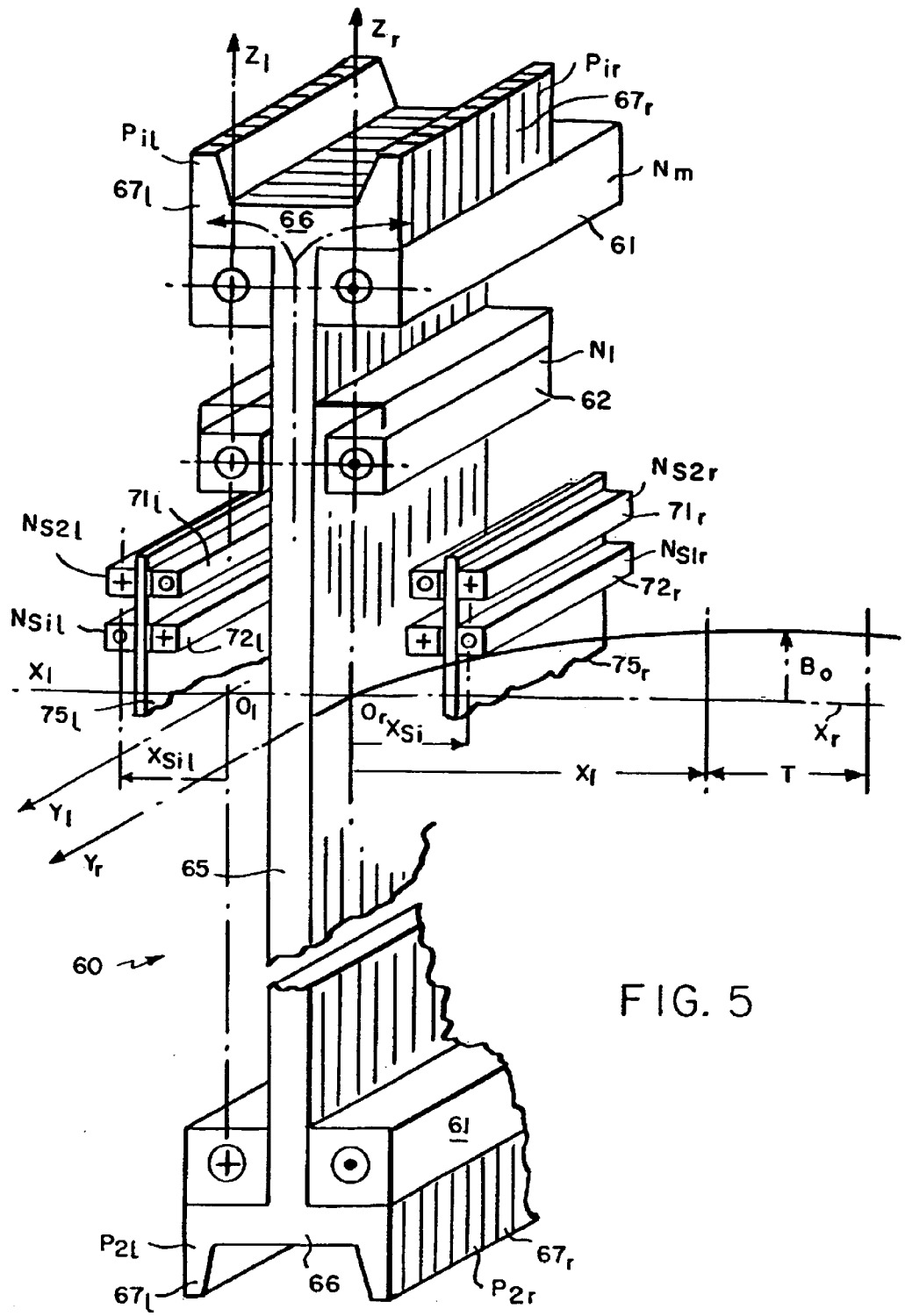
FIG. 5 is a cross sectional view of an isometric illustration, in part, of a magnet configuration for one axis of a two orthogonal axis magnet topology a double MRI system in accord with an embodiment of the present invention.

FIG. 5 illustrates an embodiment of such a magnet structure. The back to back magnet system 60 has a first pair of primary coils 61 having $N_m$ turns, and a second pair of coils 62 having $N_1$ turns coupled with a ferromagnetic core plate 65. The primary coils are spaced along the longitudinal axis (i.e., Z axis).

Ends 66 of the ferromagnetic core plate 65 are extended orthogonal to the longitudinal axis (i.e., in the X direction), both to the right and to the left of plane of the core plate 65. The ends 66 also preferably have a pole pieces 67r and 67l, which can have a geometry to aid in shaping the magnetic field provided by the magnet system.

The double side magnet is provided with symmetrical primary current wire pairs and shimming current wire pairs for the right and left sides. Shimming of the magnetic field produced by the primary coils is provided on both sides of the plate 65; on the right side by a first pair of shimming coils 71r having $N_{s2r}$ turns and a second pair of shimming coils 72r having $N_{s1r}$ turns, and on the left side by a first pair of shimming coils 71l having $N_{s2l}$ turns and a second pair of shimming coils 72l having $N_{s1l}$ turns. The pairs of shimming coils are wound about a ferromagnetic shimming core plate 75r or 75l, respectively, and spaced along the longitudinal axis thereof. Ferromagnetic shimming core plate 75r or 75l also can have orthogonal end extensions and pole pieces, similar to plate 25 (see, e.g., FIG. 3A). Ferromagnetic shimming core plates 75r and 75l are positioned in parallel with core plate 65. The primary and shimming coils are spaced symmetrically about the longitudinal centers of the ferromagnetic core plates, respectively. Typically, the longitudinal centers of the plates are aligned with the X,Y plane as illustrated. The background magnetic field $B_o$ in the Z direction along the X axis that is provided by the right side of the magnet system is illustrated. A field having the same magnitude and opposite polarity is generated on the left side.

Figure 6:
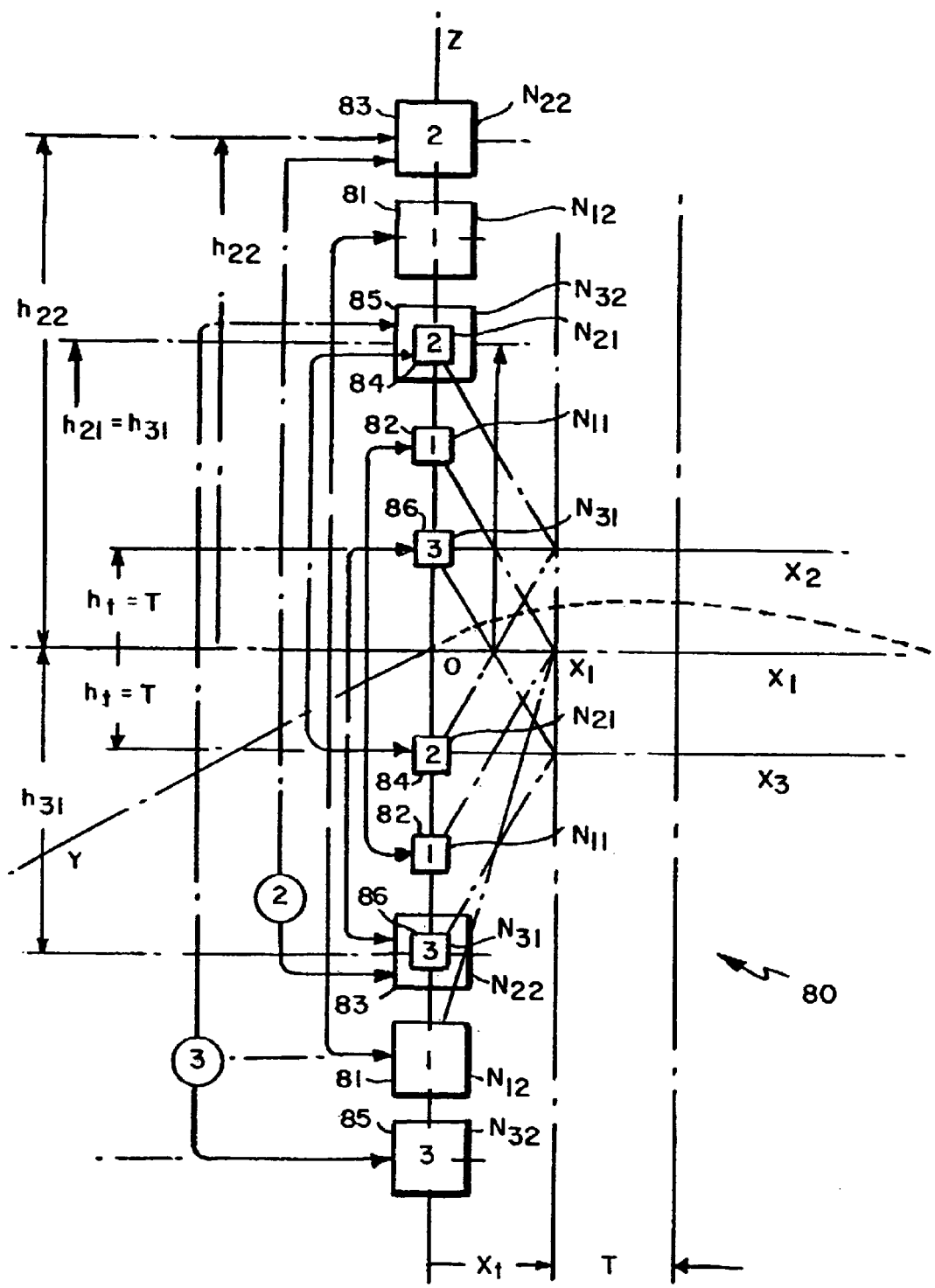
FIG. 6 is an illustration of the longitudinal axial positioning of coils for X-Z (2 dimensional) shimming of the remote region of substantial field homogeneity for one axis of a two orthogonal axis magnet topology.

An alternative shimming scheme for two dimensional shimming is illustrated in FIG. 6. For illustration purposes, only the positions of the coils along the Z axis are shown. The shimming coil system 80 provides shimming of the $B_z$ field in both the X and Z spatial directions. Two pairs of shimming coils 81, 82 having different numbers of wire turns is centered about the X axis and provides a maximum shimming field along axis $X_1$ where in this case Z=0. Two pairs of shimming coils 83, 84 are shifted along the Z axis in the positive direction and centered about axis $X_2$. Another two pairs of shimming coils 85, 86 are shifted along the Z axis in the negative direction and centered about axis $X_3$. Each of the three sets of coils (81,82; 83,84 and 85,86) are designed to provide the same X direction shimming effect. By shifting the position of the symmetric sets of coil pairs along the Z axis, a shimming effect also is provided in the Z direction. Thus, a region of the magnetic field denoted by T in the X and Z directions is affected by the three sets of shimming coils.

A device used to measure the magnetic field provided by primary electromagnetic current wires and a planar core was made with two pair of primary coils. In the first pair, each coil had 100 turns of 18 gauge copper wire and a coil width $t_N$ along the Z-axis of about 2.25 cm. Each coil was positioned along the Z-axis at a distance $h_1$ from the X-axis, providing a separation of 2 $h_1$ between the first coil pair. In the second pair, each coil had 547 turns of 18 gauge copper wire and a coil width $t_N$ along the Z-axis of 4.5 cm. These coils were positioned along the Z-axis at a distance $h_2$ from the X-axis, providing a separation of 2 $h_2$ between the second coil pair. The core was made of M6 transformer laminar steel having saturation inductance $B_S$=1.8 T (Tesla) and the core had a total thickness of 0.8 cm (each lamination thickness being approximately 0.3 mm), a width along the Y-axis of 24 cm, and a variable length along the Z-axis of up to 30 cm. The orthogonal end extension is made of the same M6 transformer steel and extends 9 cm in the X-direction from the surface of the planar core plate. Shimming devices can be added, if desired.

The effect of the length of the orthogonal end plate extensions was determined by varying the length of the end plate in increments of 1.0 cm from 0 to 9.0 cm. In the experiment, only one pair of current wire groups each having 547 wires was used. The wire groups were positioned at $h_2$=8 cm. The maximum field strength was measured perpendicular to the core plate along the X-axis. The maximum field strength increased with the length of the plate extensions. Without the end plates the device provided a maximum field of about 80 gauss in a region where X=5.5 to 7.0 cm. This can be compared with calculated field value of 40 gauss for free space, which was calculated using the Biot-Savart law methodology. With the end plate extension added, the device provided a maximum field strength of about 150 gauss in the region where X=6.5 to 8.0 cm. It should be noted that the end plate extension causes the region of maximum field strength to shift outward along the X axis.

Instead of orthogonal end plates, the angle of the end plates from the vertical toward the X-axis was varied to determine the affect of the angle on the maximum field strength. All parameters except for the angle of the end plates was kept constant. The maximum field strength increases with the angle of the end plate, at least up to an angle of 20° from the vertical.

A MRI system comprising a magnet configuration, for example, as illustrated in FIG. 3A also requires a set of xyz gradient coils to provide spatial encoding in the remote region of background $B_o$ field homogeneity for imaging. In keeping with the planar open design of the magnet geometry and configuration of the present invention, planar xyz gradient coils preferably are used. Advantageously, the remote field xyz gradient coils are preferably planar open surface coils. Preferably, the entire gradient coil is substantially in the same plane and located in front of the primary and shimming current wire pairs. Each single planar gradient coil produces a remote gradient field along the x, y or z axis in the target region of background field homogeneity. Again, although the gradient coil configurations are illustrated for a one axis magnet configuration having poles along the Z-axis, the same coil configurations can be utilized with suitable orientation for an orthogonal axis magnet.

Figure 7:
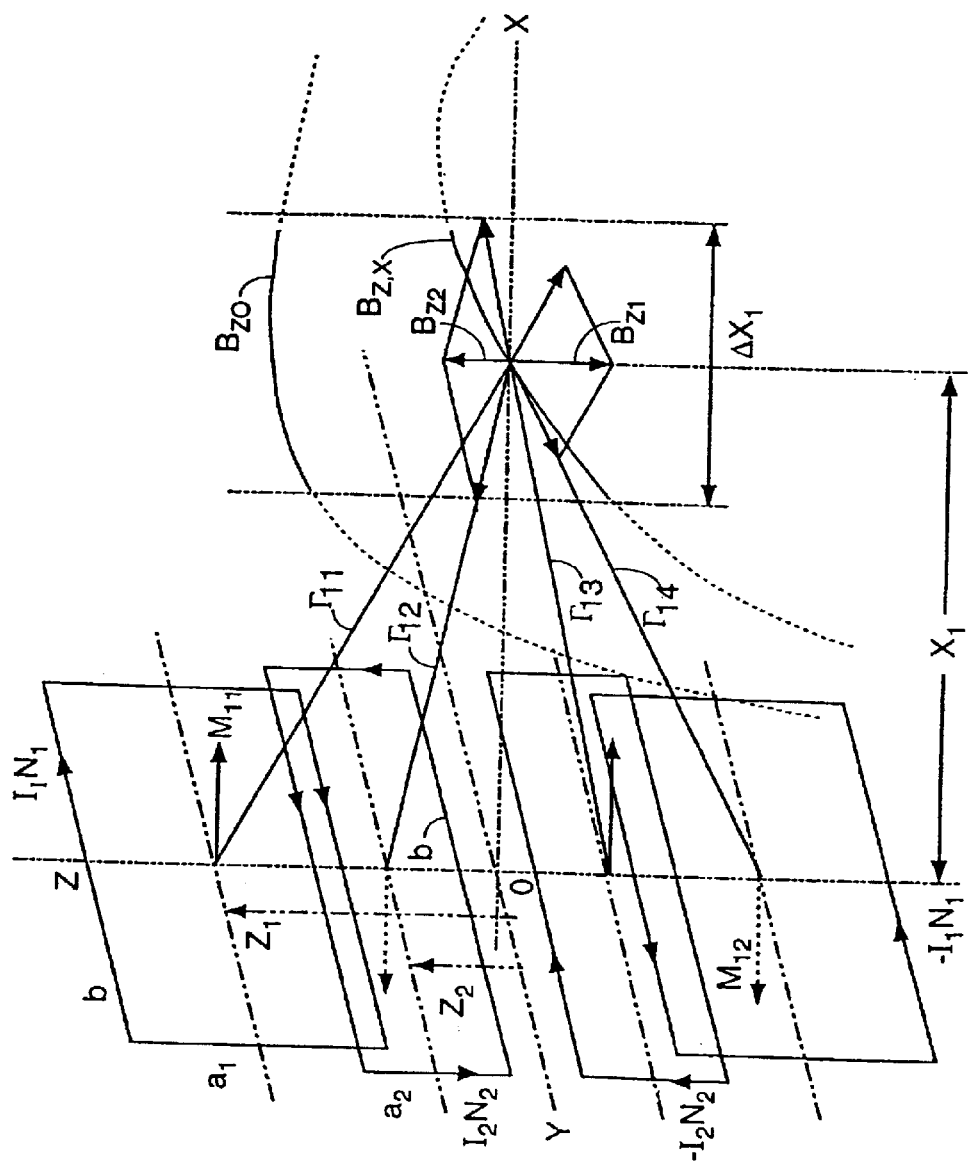
FIG. 7 is a schematic illustrating a planar remote field x-gradient coil in the form of an array of current loops for one axis of a two orthogonal axis magnet topology, and further illustrating at the center of each loop the vector magnetic dipole associated with the loop. Also illustrated are the field vectors generated by the magnet dipoles providing an approximately constant gradient field.

As illustrated in FIG. 7, a planar remote field x-gradient coil can be constructed using multiple current loops in a current loop array configuration. As shown, two external loop sections are configured to have mutually opposite current polarity. Two internal current loop sections are configured also to have mutually opposite current polarity and the current polarity in the inner loop sections is also mutually opposite its corresponding external loop section (FIG. 7A). The array loops are symmetric with respect to the y and z axes.

Also illustrated on the right side of FIG. 7 is a simple field computation approximation using the magnetic dipole moment vectors associated with the current loops. The basic $B_z$ field components at $x_1$ contributed by each of the four magnetic dipoles are shown. The vector sum of the field from the two main current loops with current $I_1$ and turns $N_1$ is denoted $B_{z1}$ and the two bias current loops with current $I_2$ and turns $N_2$ is denoted $B_{z2}$. Also illustrated on right hand side of FIG. 7 are (i) the vector sum of the field from the current loops which produces a gradient field $B_{z,x}$, which is substantially linear over the target field region $\Delta x_1$ and which corresponds to the region in which the background field $B_{z,o}$ (also shown) goes through an extremum.

Figure 8A:
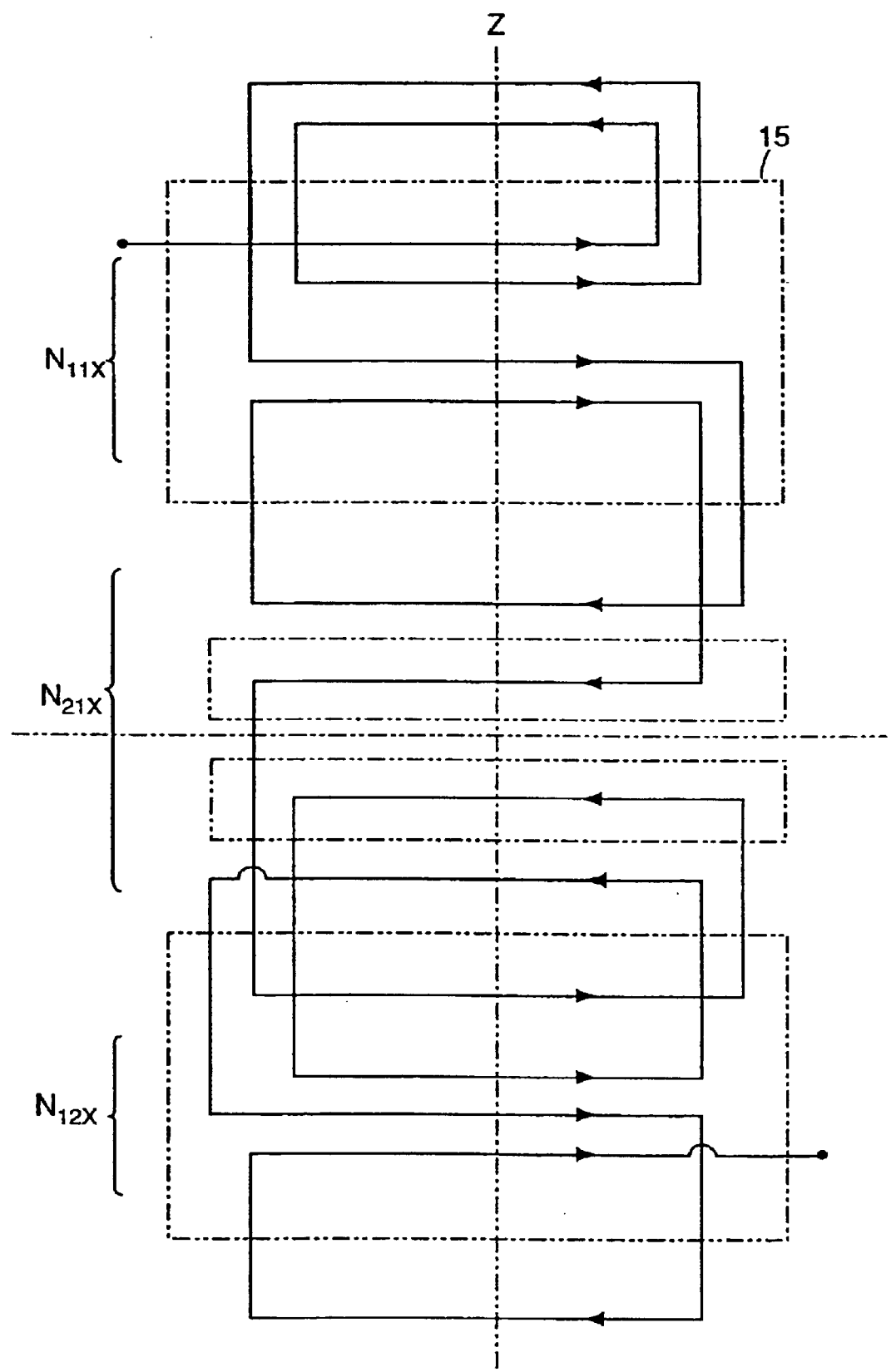
FIG. 8A is a schematic plan view illustration of a planar remote field x-gradient coil in the form of an array of current wires for one axis of a two orthogonal axis magnet topology.
Figure 8B:
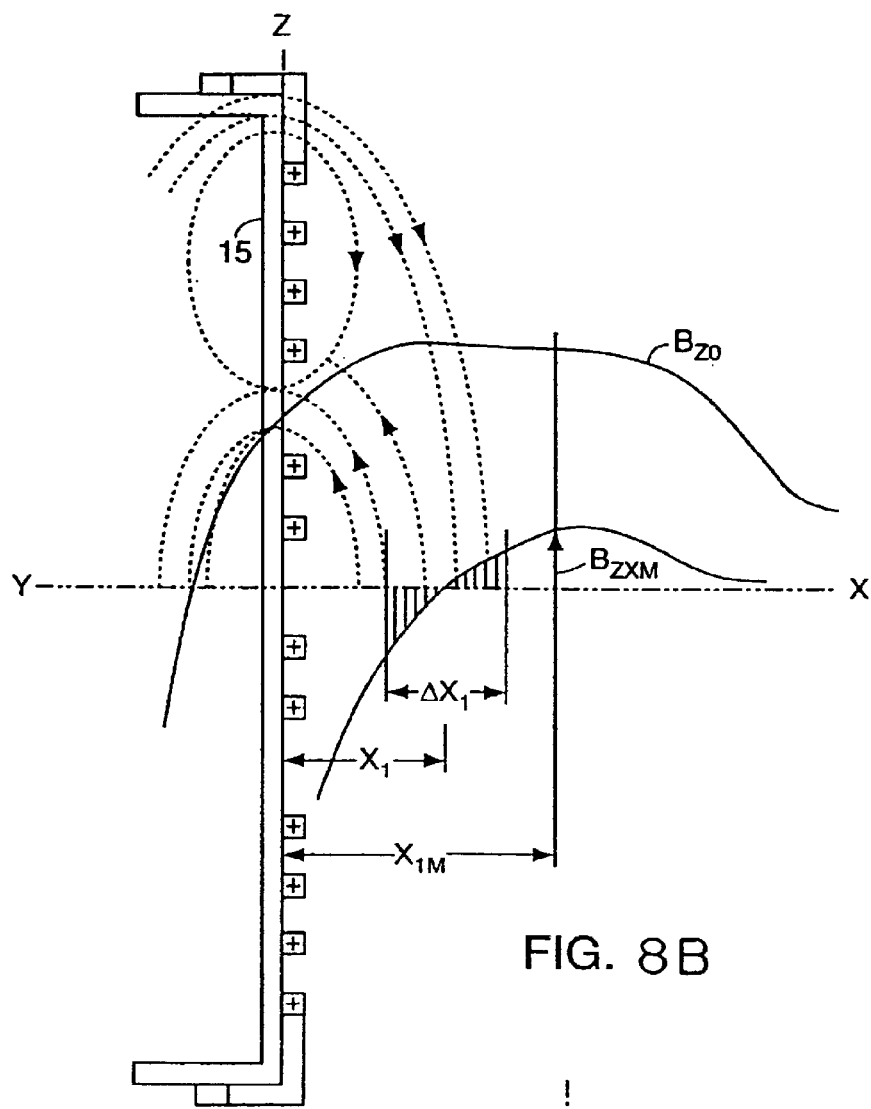
FIG. 8B is a cross sectional view of the x-gradient coil of FIG. 8A along the z-axis illustrating field lines and further schematically illustrating the $B_z$ field as a function of x at y=z=0 showing an approximately constant gradient field with respect to x.
Figure 8C:
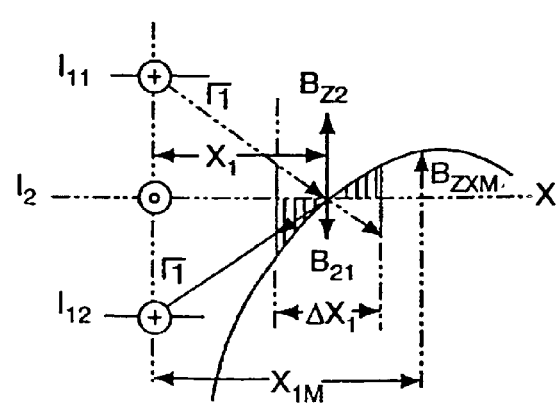
FIG. 8C illustrates a simple three current wire array and a simple computation vector diagram to aid the understanding of an X gradient field with the current wire array.

An alternative x-gradient coil structure is illustrated in FIG. 8A, with field lines of the two opposing fluxes illustrated in FIG. 8B with the resultant x-gradient field, z component, $B_{z,x}$ which is substantially linear over $\Delta x_1$ illustrated in the right side of FIG. 8B. This coil structure is a current wire array and will provide a remote linear x-gradient field similar to the current loop array depicted in FIG. 7. FIG. 8C illustrates a simple three wire system for demonstration purposes.

The x-gradient coil structure has ampere wire distribution on a planar surface 215 with two external unidirectional current wire sections $N_{11x}$ and $N_{12x}$ with a central unidirectional current section $N_{21x}$ having opposite current polarity to provide a central bias field, thereby providing a remote z-component field having substantially constant gradient as illustrated in FIG. 8B.

It should be noted that the x-gradient coil geometry is similar in concept to the magnet geometry for the $B_o$ background field.

Figure 9A:
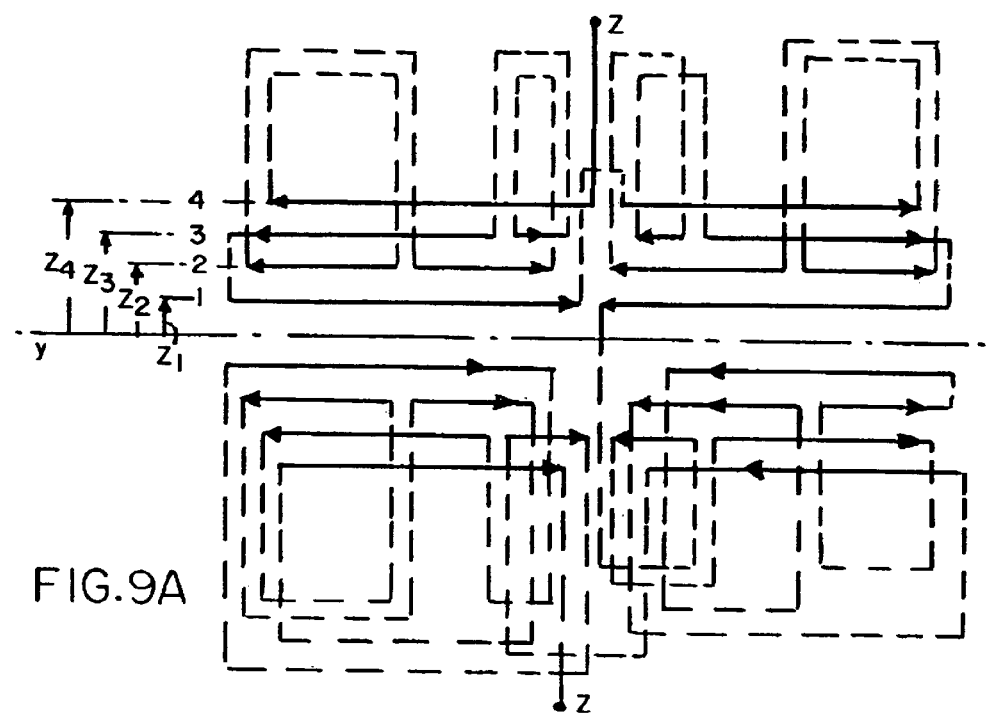
FIG. 9A is a schematic plan view illustration of a planar remote field y-gradient coil in the form of a current wire array for one axis of a two orthogonal axis magnet topology.

As illustrated in FIG. 9A, a planar remote field y-gradient coil can be constructed using a current wire array. As illustrated, the current wire array preferably has four sections corresponding to four y,z quadrants: first having coordinates 0, –y, z; the second having coordinates 0, y, z; the third having coordinates 0, –y, –z; and the fourth having coordinates 0, y, –z; in other words, the quadrant boundaries are the y and z axes in the x=0 plane. Each quadrant section is divided in subsections along the y axis. The subsections at each z-level ($z_1$, $z_2$, $z_3$ . . . ) are symmetrical about and have opposing current polarity with respect to the z-axis. The subsections are also symmetrical about and have the same current polarity with respect to the y-axis. As can be seen from FIG. 9B, the number of current wires remains constant over y at each level of z, however, the number of wires having positive and negative current polarity varies along y. The current wires providing the remote y-gradient field are connected by return wires (dashed in FIG. 9A) which are located far enough away from the desired wire current array to minimize target field disturbance.

Figure 9B:
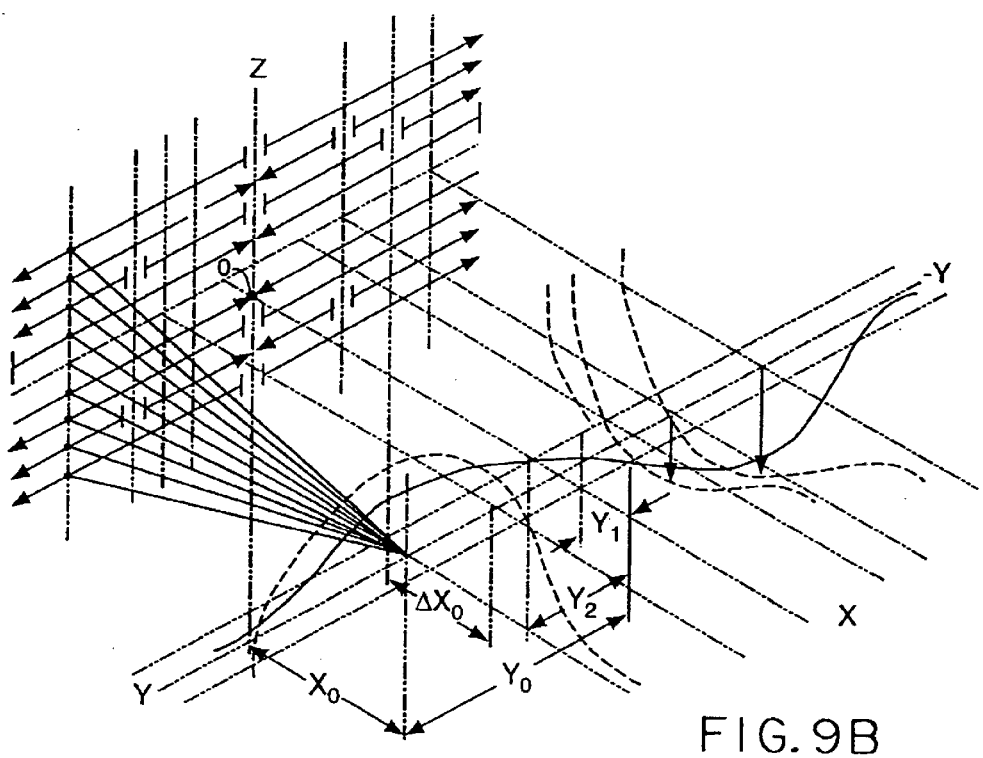
FIG. 9B is an isometric illustration of the planar array of FIG. 9A including an illustration of the remote y-gradient field provided by the array of FIG. 9A.

FIG. 9B illustrates the current wire array, which is located in the x=0 plane, extends in the y direction from $+y_o$ to $-y_o$, and provides a y-gradient field in a remote region. It illustrates only the operative current wires of the array of the wiring schematic of FIG. 9A. The y-gradient field is a field directed in the same direction z as the background field $B_o$ and which varies linearly with y. On the right side of FIG. 9B is an illustration of the y-gradient field at the remote plane $x=x_o$. Note that the field is sinusoidal as a function of y so that the region of linearity is localized around y=0. The region of linearity can be specified as a fraction of $y_o$ which is approximately 0.5 $y_o$. Thus, increasing the spatial extent of the current wire array in y can increase the region of linearity in y.

The gradient field depends upon y because the distribution of current wires with positive and negative currents parallel to the y axis changes with the y position. FIG. 9B illustrates the current pattern changes at $y=y_1$, $y_2$, etc. Thus, between $y_0$ and $y_1$, the current pattern as a function of z is constant and then changes to a different pattern between $y_1$ and $y_2$. The field produced by each of these current patterns is shown as a function of x at each incremental y position where the z pattern of the current wire array changes. In each case, the field goes through an extremum at the same value of x, in this case $x_o$, however, the amplitude of the extremum changes from positive to negative producing the gradient field.

Figure 10A:
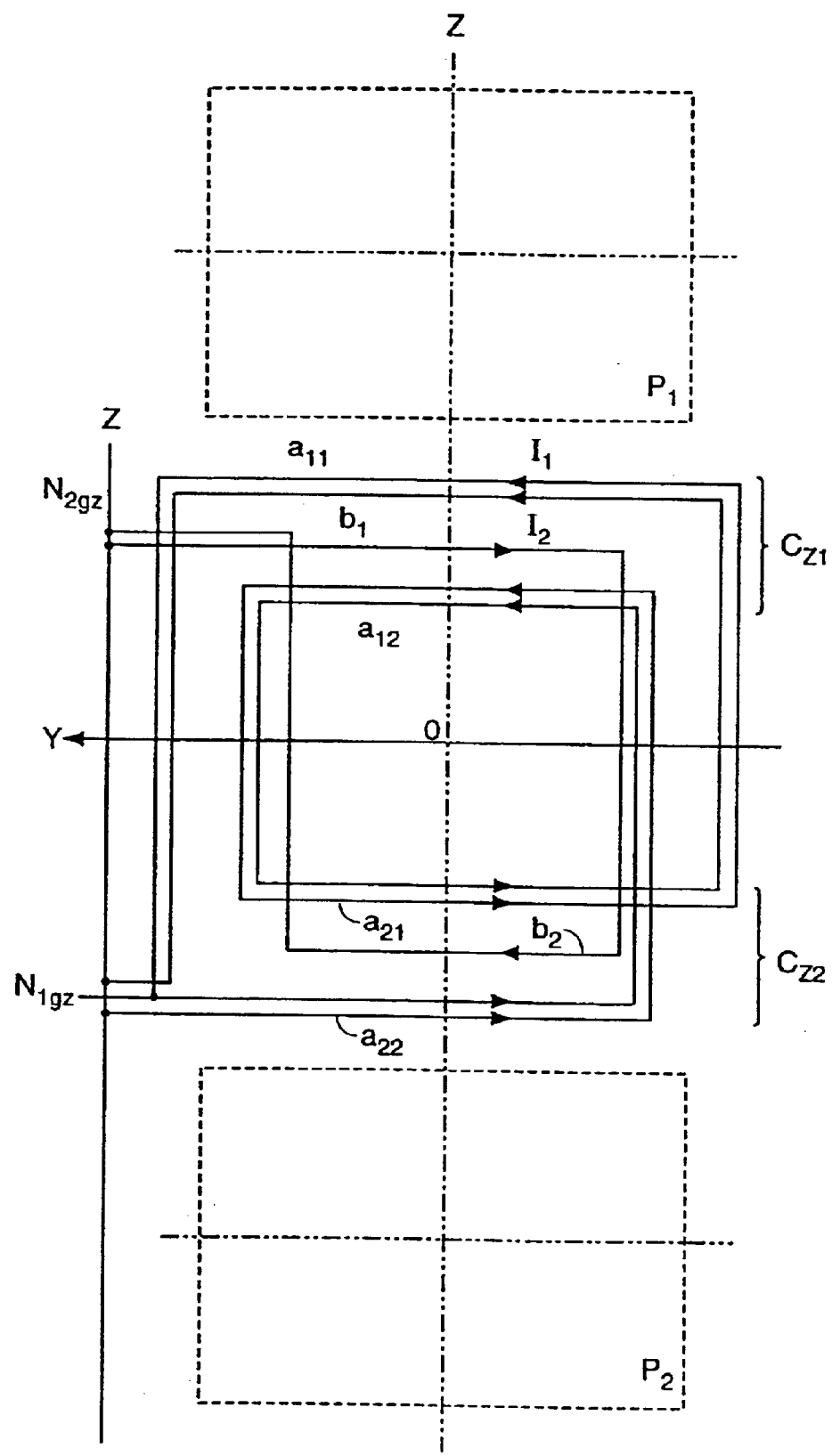
FIG. 10A is a schematic plan view illustration of a planar remote field z-gradient coil in the form of a rectangular loop array for one axis of a two orthogonal axis magnet topology.

A planar remote field z-gradient coil can be constructed between the primary current wire pairs. FIG. 10A shows the z-gradient coil as a set of current wires $a_{11}$, $b_1$ and $a_{12}$ at positive values of z and a symmetric set of opposite polarity current wires $a_{22}$, $b_2$ and $a_{21}$, located at corresponding negative values of z. The current in wires $a_{11}, a_{12}$ have current in one direction with the bias wire set $b_1$ having current in the opposite direction. The wire sets $a_{21}, a_{22}$ and $b_2$ on the opposite side of the y-axis have currents flowing in the opposite directions to the currents in the corresponding wire sets $a_{11}, a_{12}$ and $b_1$. A remote z-gradient field is provided in the target background field. All of the current wires in sets "a" are preferably are connected, as illustrated, to be supplied by a single power source. Similar to the field produced by the y-gradient coil of FIG. 9A, these two sets of current wires produce a field maximum, each of opposite sign at the remote plane $x=x_o$ at different values of z. This produces the gradient field illustrated in FIG. 10B.

Figure 10B:
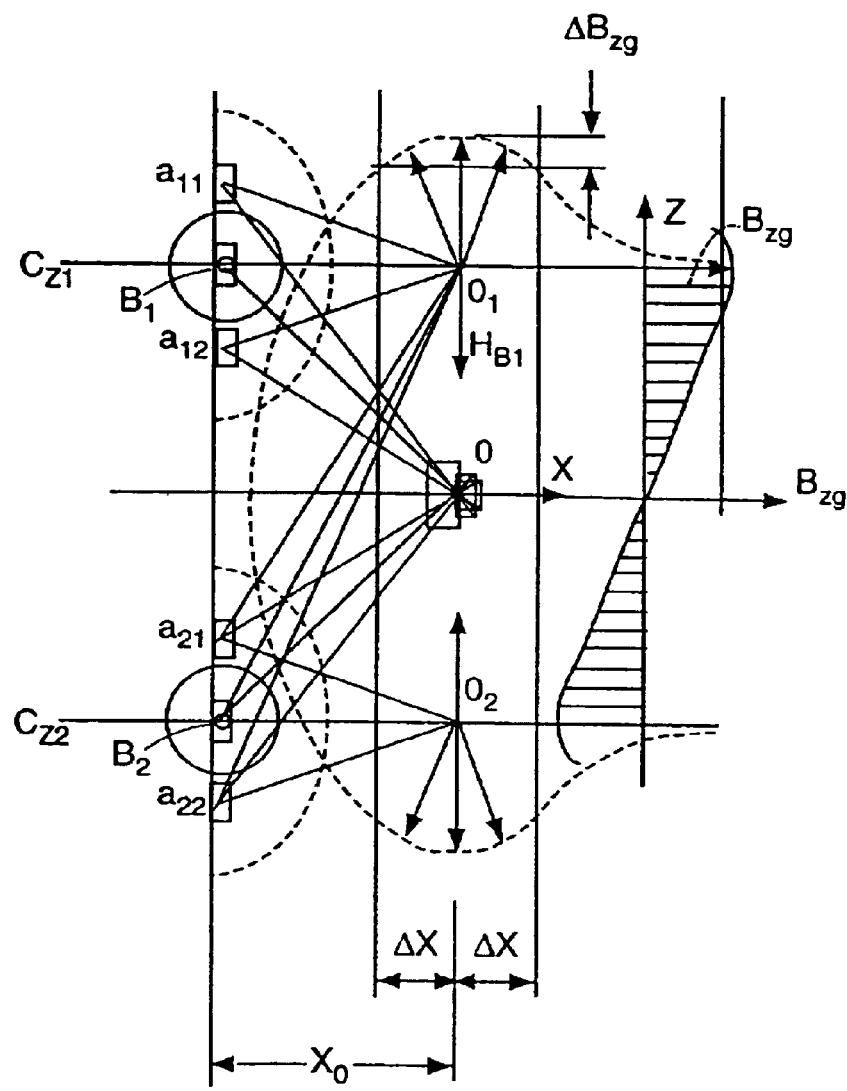
FIG. 10B is a schematic cross sectional view in the xz plane of the wires of the loop array of FIG. 10A and illustrates the remote z-gradient field provided by the z-gradient coil.

FIG. 10B shows a side cross sectional view of the z-gradient coil illustrating field line orientation in the xz plane at y=0 of the wire sets illustrated in FIG. 10A with a plot of the z component of the z-gradient field $B_{zg}$ illustrating a substantially constant gradient over a range of z.

Figure 11A:
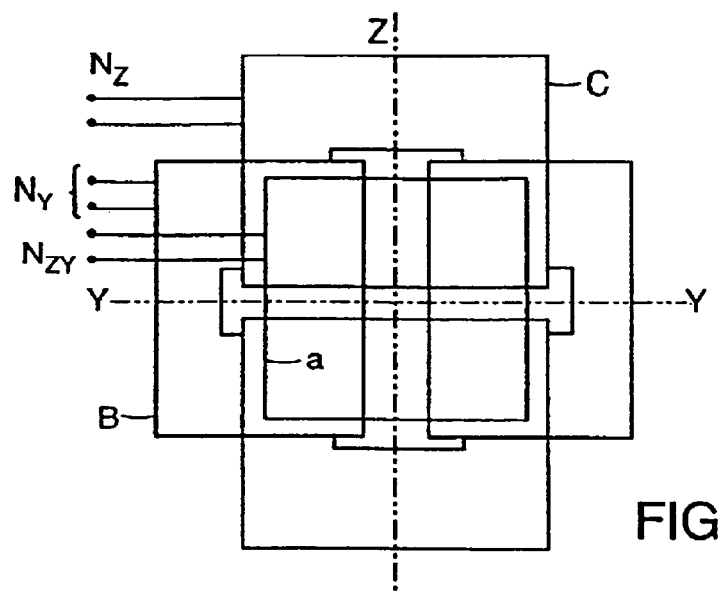
FIG. 11A is a schematic illustration of a rf coil array for excitation and detection of the nuclear magnetic resonance signal, which will provide a remote x-directional rf field orthogonal to the z and y directional background field.
Figure 11B:
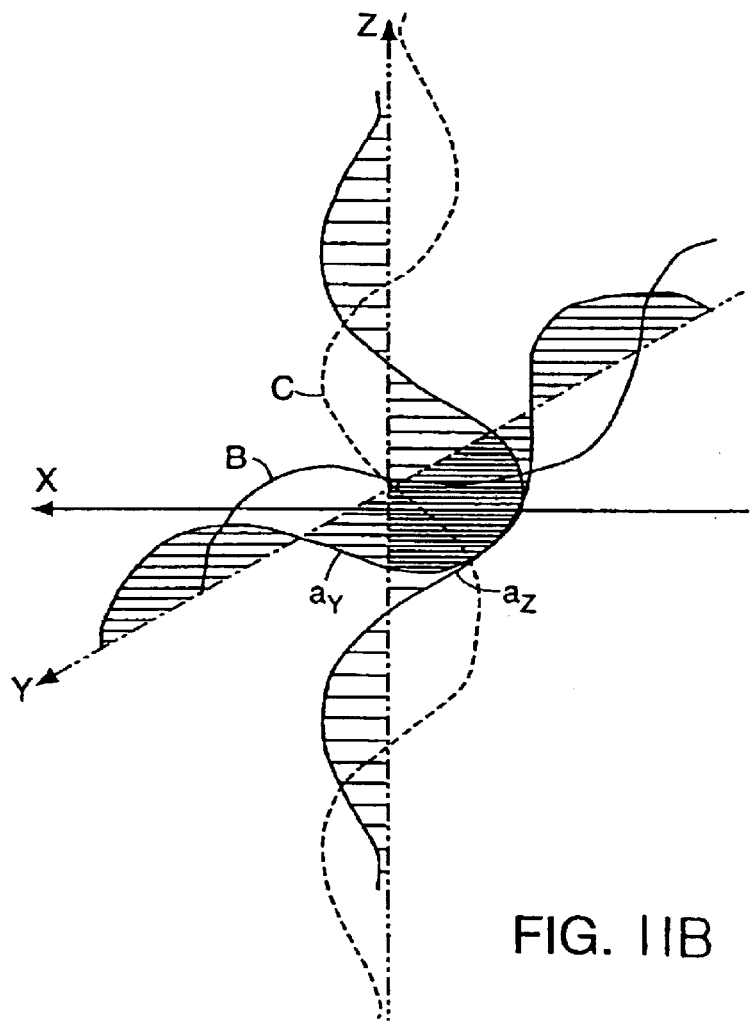
FIG. 11B illustrates the x-directional field provided by the rf coil array of FIG. 11A which is orthogonal to the z and the y-axis.

As illustrated in FIG. 11A, a planar rf coil set useful in connection with the present invention is illustrated, which provides a remote region of approximate rf field homogeneity wherein the major components are oriented orthogonal to the z component of the background field, i.e., oriented in the x-direction. The three coils illustrated can be used singly or in combination with each other to produce an rf field perpendicular to the $B_o$ field in different regions of the target volume. By varying the number of coaxial current loops in the rf coils, which can be in different but parallel planes, the region of the x-oriented rf field homogeneity can be positioned in the region of remote field homogeneity of the background field. FIG. 11B illustrates the x-directional field provided by the rf coil of FIG. 11A, which is orthogonal to the z-axis. However, it will be appreciated by those skilled in the art that the rf field must be perpendicular to the $B_o$ field (which for discussion in this specification is in the z direction). Thus, a rf field in the y direction can also be illustrated in a similar manner and provided used for excitation and detection of the nuclear magnetic resonance signal.

The open magnet configuration providing a remote background field of homogeneity for MRI can be made in any size to provide whole body capability or a portable system for more localized imaging. Shimming coils can also be used to define and position the remote region of background field homogeneity. As noted above, a complete one axis magnet system with gradient and shimming coils can be duplicated and two one axis systems positioned orthogonally to provide the two axis orthogonal magnet system of the present invention.

Planar xyz gradient and rf coils preferably are positioned below the patient table in front of the primary and shim current wire pairs and can extend over the surface between end plate extensions. The particular geometry and size of the gradient and rf coils can be optimized for each particular application, as is well known in the art.

Figure 12:
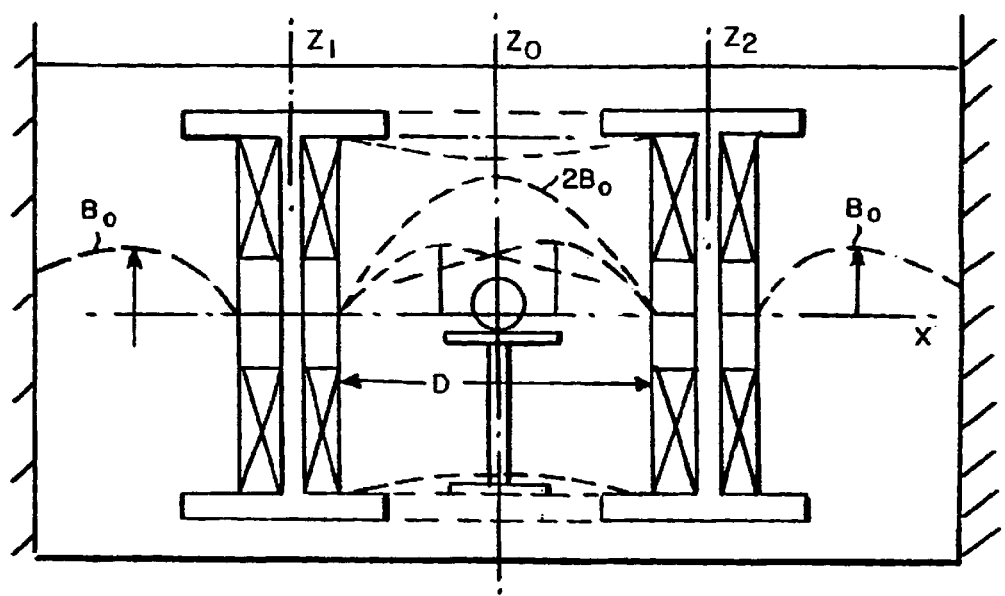
FIG. 12 is a front elevational view of two magnet configurations of the present invention in a "face to face" arrangement that provides a field having a maximum approximately twice that of one configuration standing alone.

Two of the two orthogonal axis magnet systems in accord with the present invention can be positioned adjacent to each other (i.e., "face to face") a distance D apart, as illustrated in FIG. 12. In such case, the magnetic fields provided by the two individual magnet systems, one located on the $Z_1$ axis and the second on the $Z_2$ axis, are additive and provide a substantially increased field strength at the with a maximum along the X axis, the maximum being located on the $Z_0$ axis for the illustrated system. Shimming current wire pairs (not shown) preferably also are used to provide the desired field shape for the application. Gradient and rf coils (not shown) are also provided for MR imaging, as discussed above.

Figure 13A:
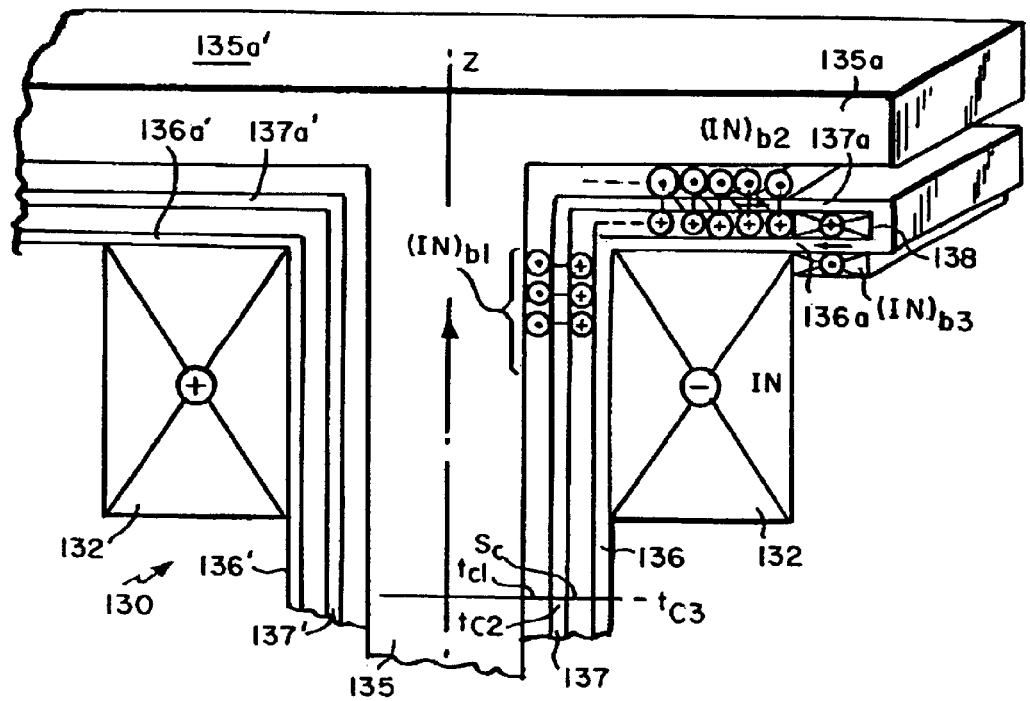
FIG. 13A is an illustration of part of a magnet configuration in accord with a preferred embodiment of the invention showing a construction to provide a layer of ferromagnetic core operating near magnetic saturation adjacent to the current wires providing the primary magnetic field.

In order to obtain the refraction effect of a planar ferromagnetic core, it has been discovered that it is sufficient to have only a thin layer at the surface of the ferromagnetic plate material performing near saturation to obtain orthogonal refraction effect, while the major portions of the core can be saturated or "oversaturated." Therefore, a preferred ferromagnetic core structure to benefit from the refraction effect and to prevent the core from saturation at surface layer adjacent to the current wire pairs emitting the remote field is illustrated in FIG. 13A. The magnet system 130 comprises at least one set of current wire pairs (one set of current wires 132 being illustrated) and a primary ferromagnetic core plate 135 with an end plate extension 135a (135a' optional for a second field, if desired). Ferromagnetic plates 136, 137 are constructed in parallel with the primary core plate 135, but have substantially thinner plate thickness. End plate extensions 136a, 137a are also constructed parallel to primary end plate extension 135a. End plate extensions 136a and 137a are connected structurally and magnetically by ferromagnetic plate 138 to form a closed loop. The other end (not shown) of the magnet system 130 is similarly constructed in a symmetric mirror image construction. Thus, plates 136 and 137 are parts of a continuous mechanically closed magnetic flux loop.

A bias coil constructed in three sections $IN_{b1}$, $IN_{b2}$ and $IN_{b3}$ generates a magnetic flux in the closed magnetic loop. The direction of the magnetic flux in plate 136 and end plate extension 136a that is generated by the bias coil is opposite to the flux generated by the primary current wire pairs 132. One or more bias coil sections are used to provide a bias flux in the magnetic loop preferably to maintain the total magnetic flux in plates 136 and end plate 136a at or near saturation of the B field. Thus, plate 136 and end plate 136a provide substantially orthogonal refraction of the primary current wire pairs and provide independent magnetic field generation for the current wire pairs on the right of the core from the magnetic field generation of the current wire pairs on the left of the core plate 136. The bias coils provide a demagnetization flux to compensate for the saturation induction of the primary field coils and maintain the surface layer near saturation.

Figure 13B:
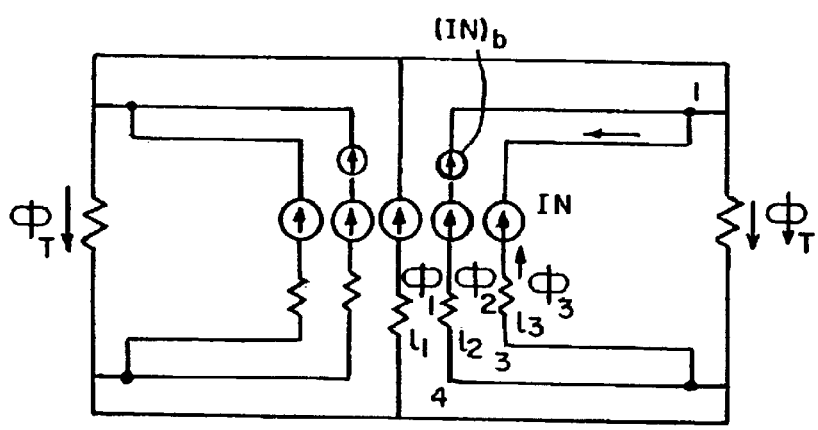
FIG. 13B is an equivalent magnetic circuit for the magnet configuration of FIG. 13A.

Core plates 135, 135a, 137 and 137a typically are made of M6 transformer steel having a saturation inductance with $B_s$=1.8 T. Preferably, core plates 136 and 136a are made of steel having a higher saturation inductance with Bs=2.2 to 2.5 T, as well as a higher permeability prior to saturation. An equivalent magnetic circuit for the magnet system 130 is illustrated in FIG. 13B to provide an analytical tool for design optimization. Shimming, gradient and rf coils, as discussed above, are provided for MR imaging. Optionally, core plates 136', 136a', 137' and 137a' are provided along with suitable bias coils, if a "back to back" or double magnetic field system is desired.

It is known that certain magnetic properties of materials can be represented by a B vs H curve where B is the magnetic induction and H is the magnetic intensity. The ferromagnetic core material preferably operates close to saturation for the material used. Typically, close to saturation means that the system is designed, structured and arranged so that the ferromagnetic core layer adjacent to the primary current wire pairs operates with the ferromagnetic material having a magnetic intensity H within about 20% of $H_{sat}$, more preferably within 10% of $H_{sat}$, most preferably within 5% of $H_{sat}$. In general, the minimum H should be greater than H at the initial region of non-linearity and the maximum H should be slightly less than $H_{sat}$.

Figures 14A, 14B:
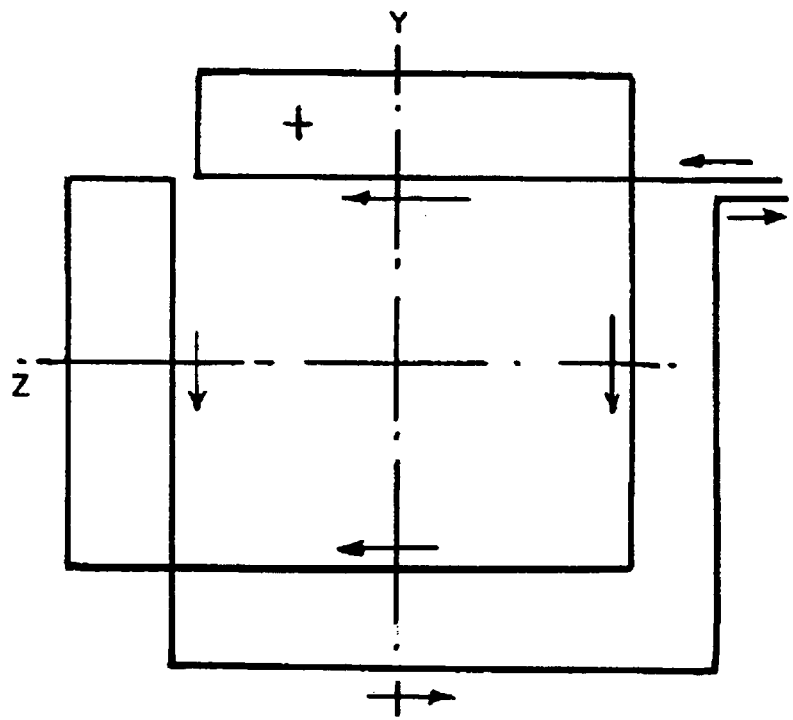
FIG. 14A is a plan view illustrating a plan view of a wiring layout (core structure not shown) for the primary current wire pairs for a two orthogonal axis magnet system in accord with the present invention.
FIG. 14B is a cross-section at the Y-axis of a core structure with the wire pairs for the wiring layout illustrated in FIG. 14A.

An essentially two-dimensional wire topology for the primary current wire pairs for a two orthogonal axis magnet system in accord with the present invention is illustrated in FIG. 14A. A cross-section at the Y-axis of a core structure with the wire pairs is illustrated in FIG. 14B.

FIG. 15A illustrates a one axis double sided magnet that provides a differential flux in the vertical core section 301 which permits core section 301 to have flux at less than saturation. To do so, $N_1$>$N_2$. FIG. 15B illustrates a similar double sided magnet to that in FIG. 15A but having a reduced thickness vertical core section with to low inductance due to the differential flux. In this embodiment, the horizontal core sections orthogonal to the vertical core section have tapered ends to reduce horizontal core material. These topologies will provide the refraction effect for the vertical core section due to the unsaturated vertical core section. A two orthogonal axis magnet system can be made by orthogonal orientation of two of these double sided magnets.

FIGS. 16A and 16B illustrate one end of a one axis double sided magnet 400 configuration configured to provide a quadro refraction in a corner of a core, i.e., for both the vertical core section and a horizontal core section. To provide differential flux in vertical core section 401, $N_3$>$N_4$. To provide differential flux in horizontal core section 410, the return wires for coil $N_3$ are divided so that a portion are arranged on either side of horizontal core section 410, where $N_{3,a} \neq N_{3,b}$ to provide a differential flux in the horizontal core section 410 so that it is unsaturated whereas horizontal core section 412 is saturated. Similarly, the return wires for coil $N_4$ are divided so that a portion are arranged on either side of horizontal core section 410, where $N_{4,a} \neq N_{4,b}$ keeping the ratios between corresponding $N_3$ and $N_4$ segments the same. The opposite end of the one axis double sided magnet is similarly structured and configured.

Figure 17:
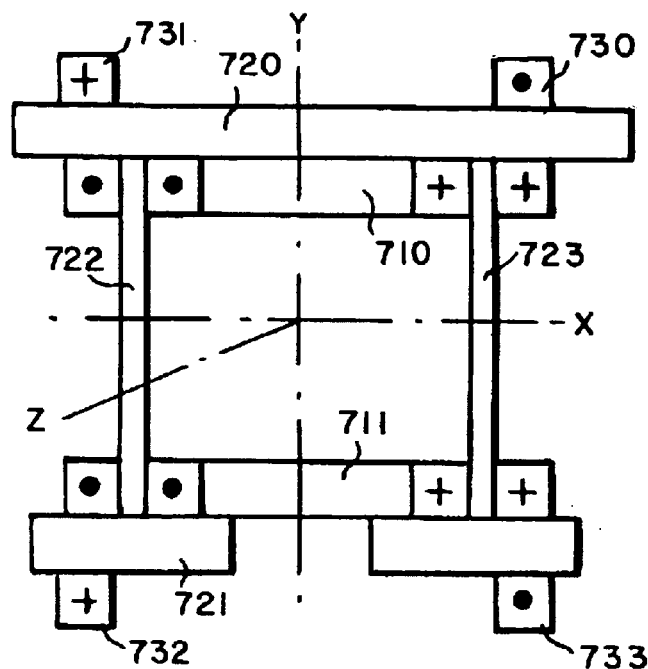
FIG. 17 is a cross-sectional illustration of a preferred embodiment magnet configurations of the present invention in an arrangement that provides a central field within the core plates having a field maximum approximately twice that of a configuration such as illustrated in FIG. 2B, and further has two additional field maximums produced externally on the left and right sides of vertical core plates around the central field.

FIG. 17 illustrates another embodiment of the present invention. Primary coils 710, 711 are formed as square wire loops and provide a magnetic field maximum within the return flux core plates 720, 721, 722, 723. Access to the center of the internal magnetic field is provided through an opening 725 in the lower (as depicted) core plate. The vertical core plates 722, 723 can be made thinner and provide an unsaturated condition to the differential flux provided by external coils 730, 731, 732, 733 which provide a counter flux to that of the primary square loop coils. This configuration also provides a an external field maximum on each side of the central field. A quadro refraction effect is provided by the arrangement of the return flux core plates.

The invention has been described in detail with reference to preferred embodiments thereof. However, it will be appreciated that, upon consideration of the present specification and drawings, those skilled in the art may make modifications and improvements within the spirit and scope of this invention as defined by the claims. For example, other magnet configurations can be use for providing the primary field or for shimming. Indeed, the current wire pairs generating the primary field or the shimming field can be divided into any number of groups having different numbers of wires and different spacings along the longitudinal axis.

What is claimed is:

1. A planar MRI system having an open magnet configuration that produces a magnetic field having a remote region of substantial magnetic field homogeneity, spatial encoding gradient coils and a rf coil, the open magnet configuration comprising:
   a first magnet system having a first ferromagnetic core and a first longitudinal axis with a first pair of coils around the first ferromagnetic core and spaced apart along the first longitudinal axis, the first pair of coils providing first pairs of separated current wires of the same polarity; and
   a second magnet system having a second ferromagnetic core and a second longitudinal axis with a second pair of coils around the second ferromagnetic core and spaced apart along the second longitudinal axis, the second pair of coils providing second pairs of separated current wires of the same polarity;
   wherein the first magnet system and the second magnet system are orthogonal to each other in substantially the same plane.

2. The MRI system of claim 1, wherein the first ferromagnetic core and the second ferromagnetic core are a unified core structure.

3. The MRI system of claim 1, wherein each of the first magnet system and the second magnet system comprise:
   a ferromagnetic core having a substantially planar core surface layer and a longitudinal axis; and
   a unipolar current wire pair on a side of the ferromagnetic core adjacent said planar core surface layer, the wire pair being separated along said longitudinal axis and extending in a direction substantially perpendicular to the axis and substantially parallel to the planar core surface layer,
   the current wire pair providing a magnetic field having a maximum between the current wire pair along a direction perpendicular to said planar core surface layer and in said remote region of substantial magnetic field homogeneity,
   the planar core surface layer of the ferromagnetic core providing an orthogonal refractory effect that substantially increases the resulting magnetic field compared to a magnetic field generated by the current wire pair in free space.

4. The MRI system of claim 3, wherein the first ferromagnetic core and the second ferromagnetic core are a unified core structure.

5. The MRI system of claim 4, wherein the ferromagnetic core comprises a plurality of layers of ferromagnetic material including said planar core surface layer, which is adjacent said current wire pair, said magnet configuration being constructed and adapted such that the core surface layer operates near a magnetic saturation value of the ferromagnetic material forming the core surface layer.

6. The MRI system of claim 5, wherein the core surface layer comprises a ferromagnetic material having a magnetic property including a $H_{sat}$ value and the core surface layer operates within about 20% of the $H_{sat}$ value.

7. The MRI system of claim 5, wherein the core surface layer comprises a ferromagnetic material having a magnetic property including a $H_{sat}$ value and the core surface layer operates within about 10% of the $H_{sat}$ value.

8. The MRI system of claim 5, wherein the core surface layer comprises a ferromagnetic material having a magnetic property including a $H_{sat}$ value and the core surface layer operates within about 5% of the $H_{sat}$ value.

9. The MRI system of claim 5, wherein the core surface layer comprises a ferromagnetic material having a magnetic property including a $H_{sat}$ value and the core surface layer operates in range having a minimum H at a value greater than the initial non-linearity having a maximum of $H_{sat}$.

10. The MRI system of claim 5, wherein the core surface layer comprises a first ferromagnetic material and at least one of the layers comprises a second ferromagnetic material, wherein the first ferromagnetic material has a higher saturation induction and permeability than the second ferromagnetic material.

11. The MRI system of claim 3, further comprising a ferromagnetic end extension extending from the plane of planar core surface layer, the end extension being positioned adjacent to a wire of and longitudinally exterior of the current wire pair.

12. The MRI system of claim 11, wherein the ferromagnetic end extension comprises a plurality of layers of ferromagnetic material including an end extension surface layer that is adjacent a wire of said current wire pair, said magnet configuration being constructed and adapted such that the end extension surface layer operates near a magnetic saturation value of the ferromagnetic material forming the end plate surface layer.

13. The MRI system of claim 12, wherein the end extension surface layer comprises a ferromagnetic material having a magnetic property including a $H_{sat}$ value and the end extension surface layer operates within about 20% of the $H_{sat}$ value.

14. The MRI system of claim 12, wherein the end extension surface layer comprises a ferromagnetic material having a magnetic property including a $H_{sat}$ value and the end extension surface layer operates within about 10% of the $H_{sat}$ value.

15. The MRI system of claim 12, wherein the end extension surface layer comprises a ferromagnetic material having a magnetic property including a $H_{sat}$ value and the end extension surface layer operates within about 5% of the $H_{sat}$ value.

16. The MRI system of claim 12, wherein the end extension surface layer comprises a ferromagnetic material having a magnetic property including a $H_{sat}$ value and the end extension surface layer operates in range having a minimum H at a value greater than the initial non-linearity having a maximum of $H_{sat}$.

17. The MRI system of claim 11, wherein the end extension surface layer comprises a first ferromagnetic material and at least one of the layers comprises a second ferromagnetic material, wherein the first ferromagnetic material has a higher saturation and permeability than the second ferromagnetic material.

18. The MRI system of claim 11, wherein the ferromagnetic end plate extends perpendicular to the ferromagnetic core.

19. The MRI system of claim 11, wherein the ferromagnetic end plate extends at an acute angle from the perpendicular to the planar core surface layer and in a direction toward the current wire pair.

20. The MRI system of claim 19, wherein said angle is between 0 and about 20°.

21. The MRI system of claim 3, further comprising a shimming current wire pair located on a side of the ferromagnetic core closest to said planar core surface layer.

22. The MRI system of claim 21, further comprising a ferromagnetic shimming core having a planar shimming core surface layer adjacent to said shimming current wire pair.

23. An MRI system having an open back to back magnet configuration that produces two independent magnetic fields, each having a remote region of substantial magnetic field homogeneity, the system comprising spatial encoding gradient coils and a rf coil for each remote region, the open magnet configuration comprising:

a first magnet system having a first ferromagnetic core and a first longitudinal axis with a first pair of coils around the first ferromagnetic core and spaced apart along the first longitudinal axis; and a second magnet system having a second ferromagnetic core and a second longitudinal axis with a second pair of coils around the second ferromagnetic core and spaced apart along the second longitudinal axis;

wherein the first magnet system and the second magnet system are orthogonal to each other in substantially the same plane;

wherein each of the first magnet system and the second magnet system comprise:

a ferromagnetic core having a longitudinal axis, a first and a second side, each side having substantially planar core surface layer; and a unipolar current wire pair on each side of the ferromagnetic core adjacent said planar core surface layer, the wire pair being separated along said longitudinal axis and extending in a direction substantially perpendicular to the axis and substantially parallel to the planar core surface layer, wherein said unipolar current wire pair on each side of the ferromagnetic core are provided by a pair of current loops wound around the ferromagnetic core;

each current wire pair providing a magnetic field having a maximum between the current wire pair along a direction perpendicular to said planar core surface layer and in said remote region of substantial magnetic field homogeneity, the planar core surface layer of the ferromagnetic core adjacent each current wire pair providing an orthogonal refractory effect that substantially increases the resulting magnetic field compared to a magnetic field generated by the current wire pair in free space.

24. A MRI system having two face to face open magnet configurations that each produce a magnetic field having a remote region of substantial magnetic field homogeneity, spatial encoding gradient coils and a rf coil, wherein a first and a second open magnet configuration each comprise:

a first magnet system having a first ferromagnetic core and a first longitudinal axis with a first pair of coils around the first ferromagnetic core and spaced apart along the first longitudinal axis; and a second magnet system having a second ferromagnetic core and a second longitudinal axis with a second pair of coils around the second ferromagnetic core and spaced apart along the second longitudinal axis;

wherein the first magnet system and the second magnet system are orthogonal to each other in substantially the same plane;

wherein each of the first magnet system and the second magnet system comprise:

a ferromagnetic core having a substantially planar core surface layer and a longitudinal axis; and a unipolar current wire pair on a side of the ferromagnetic core adjacent said planar core surface layer, the wire pair being separated along said longitudinal axis and extending in a direction substantially perpendicular to the axis and substantially parallel to the planar core surface layer, the current wire pair providing a magnetic field having a maximum between the current wire pair along a direction perpendicular to said planar core surface layer and in said remote region of substantial magnetic field homogeneity, the planar core surface layer of the ferromagnetic core providing an orthogonal refractory effect that substantially increases the resulting magnetic field compared to a magnetic field generated by the current wire pair in free space, wherein the remote region of substantial magnetic field homogeneity provided by a first open magnet configuration overlaps the remote region of substantial magnetic field homogeneity provided by a second open magnet configuration, thereby providing a total magnetic field equal to the sum of the remote regions provided by the first and the second open magnet configurations.

\* \* \* \* \*